(12) United States Patent
Fujiwara et al.

(10) Patent No.: US 12,248,073 B2
(45) Date of Patent: Mar. 11, 2025

(54) LIGHT DETECTOR, LIGHT DETECTION SYSTEM, LIDAR DEVICE, AND VEHICLE

(71) Applicant: KABUSHIKI KAISHA TOSHIBA, Tokyo (JP)

(72) Inventors: Ikuo Fujiwara, Yokohama Kanagawa (JP); Honam Kwon, Kawasaki Kanagawa (JP); Yuki Nobusa, Yokohama Kanagawa (JP); Keita Sasaki, Yokohama Kanagawa (JP); Kazuhiro Suzuki, Tokyo (JP); Masaki Atsuta, Yokosuka Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1193 days.

(21) Appl. No.: 17/015,165

(22) Filed: Sep. 9, 2020

(65) Prior Publication Data

US 2021/0132230 A1    May 6, 2021

(30) Foreign Application Priority Data

Oct. 30, 2019 (JP) .................. 2019-197576

(51) Int. Cl.
*G01S 17/931*    (2020.01)
*G01S 7/481*    (2006.01)
*G01S 17/89*    (2020.01)
*H01L 31/107*    (2006.01)

(52) U.S. Cl.
CPC .......... *G01S 17/931* (2020.01); *G01S 7/4813* (2013.01); *G01S 17/89* (2013.01); *H01L 31/107* (2013.01)

(58) Field of Classification Search
CPC ...... G01S 17/931; G01S 7/4813; G01S 17/08; G01S 17/42; G01S 7/4816; H01L 31/107; H01L 31/1075; H01L 31/18
See application file for complete search history.

(56) References Cited

U.S. PATENT DOCUMENTS

| | | |
|---|---|---|
| 2009/0121306 A1 | 5/2009 | Ishikawa |
| 2009/0256223 A1 | 10/2009 | Yamamura et al. |
| 2010/0108893 A1 | 5/2010 | Flitsch et al. |
| 2010/0148040 A1 | 6/2010 | Sanfilippo et al. |
| 2012/0153423 A1 | 6/2012 | Lee |
| 2014/0263975 A1* | 9/2014 | Nagano ............. H01L 27/14643 250/208.2 |
| 2017/0299699 A1 | 10/2017 | Yonehara et al. |
| 2018/0158849 A1 | 6/2018 | Henkel et al. |
| 2019/0051767 A1 | 2/2019 | Yamamoto et al. |

(Continued)

FOREIGN PATENT DOCUMENTS

| | | |
|---|---|---|
| EP | 3 493 275 A1 | 6/2019 |
| JP | 2001-352095 A | 12/2001 |

(Continued)

*Primary Examiner* — Isam A Alsomiri
*Assistant Examiner* — Joseph C Fritchman
(74) *Attorney, Agent, or Firm* — Finnegan, Henderson, Farabow, Garrett & Dunner, LLP

(57) ABSTRACT

According to one embodiment, a light detector includes an element including a photodiode. A plurality of the elements are provided. The element includes a structure body for at least a portion of the plurality of elements. The structure body surrounds the photodiode and has a different refractive index from the photodiode. At least portions of the structure bodies are separated from each other.

17 Claims, 32 Drawing Sheets

(56) References Cited

U.S. PATENT DOCUMENTS

2019/0288149 A1    9/2019  Kokubun
2019/0371849 A1   12/2019  Ishida et al.
2021/0134862 A1*   5/2021  Ishida ............... H01L 27/14607

FOREIGN PATENT DOCUMENTS

| JP | 2005-45125 A | 2/2005 |
| JP | 5183471 B2 | 4/2013 |
| JP | 2014-225714 A | 12/2014 |
| JP | 2017-117835 A | 6/2017 |
| JP | 2019-161047 A | 9/2019 |
| WO | WO 2018/021413 A1 | 2/2018 |
| WO | WO 2018/108981 A1 | 6/2018 |

* cited by examiner

LIGHT DETECTOR, LIGHT DETECTION SYSTEM, LIDAR DEVICE, AND VEHICLE

CROSS-REFERENCE TO RELATED APPLICATIONS

This application is based upon and claims the benefit of priority from Japanese Patent Application No. 2019-197576, filed on Oct. 30, 2019; the entire contents of which are incorporated herein by reference.

FIELD

Embodiments described herein relate generally to a light detector, a light detection system, a lidar (Laser Imaging Detection and Ranging (LIDAR)) device, and a vehicle.

BACKGROUND

A light detector detects light incident on an element including a photodiode. It is desirable to improve the performance of the light detector.

DETAILED DESCRIPTION

Figure 1:
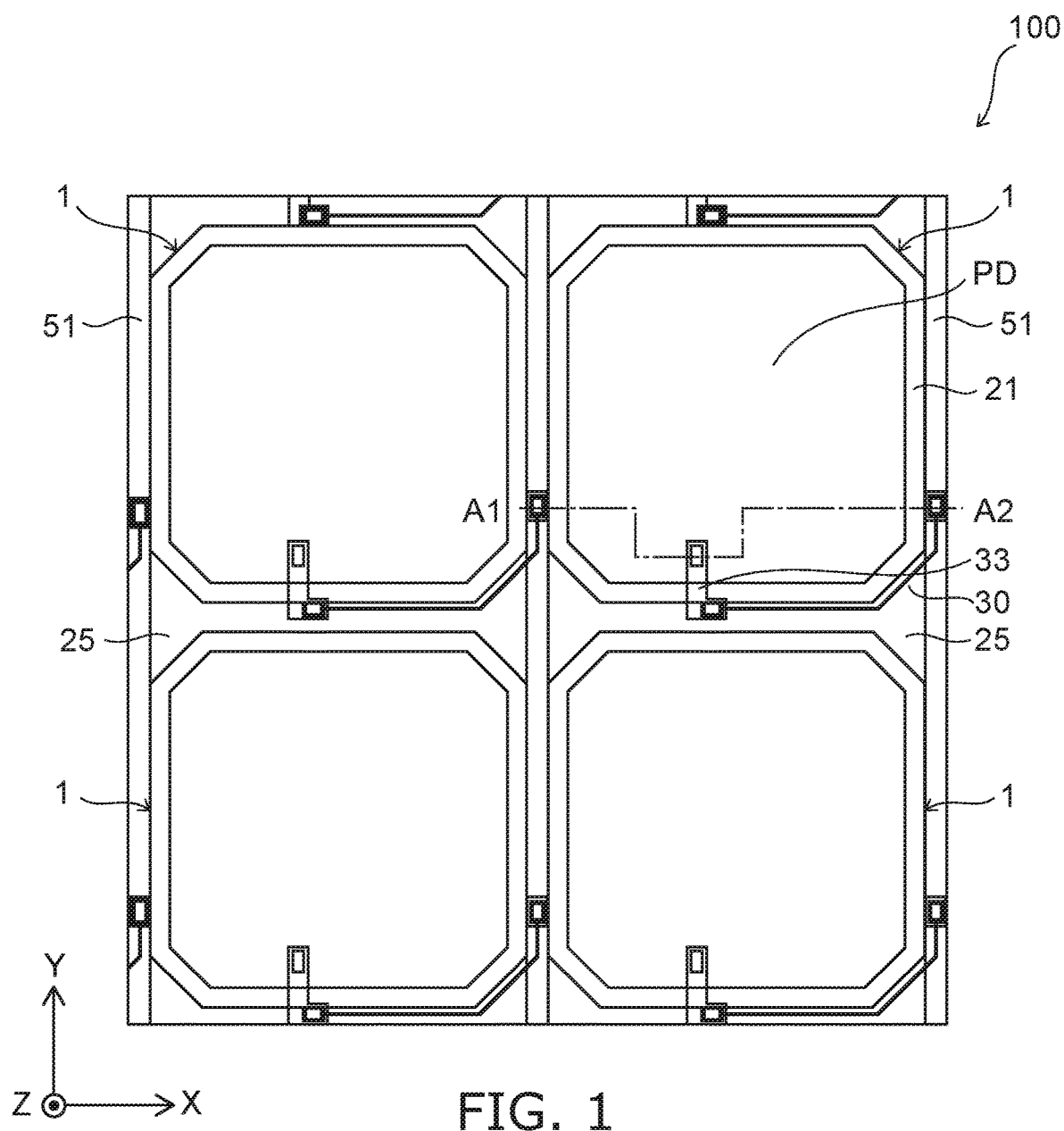
FIG. 1 is a schematic plan view illustrating a portion of a light detector according to a first embodiment.

According to one embodiment, a light detector includes an element including a photodiode and a structure body surrounding the photodiode. The structure body has a different refractive index from the photodiode. A plurality of the elements are provided. At least portions of the structure bodies are separated from each other.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic plan view illustrating a portion of a light detector according to a first embodiment.

Figure 2:
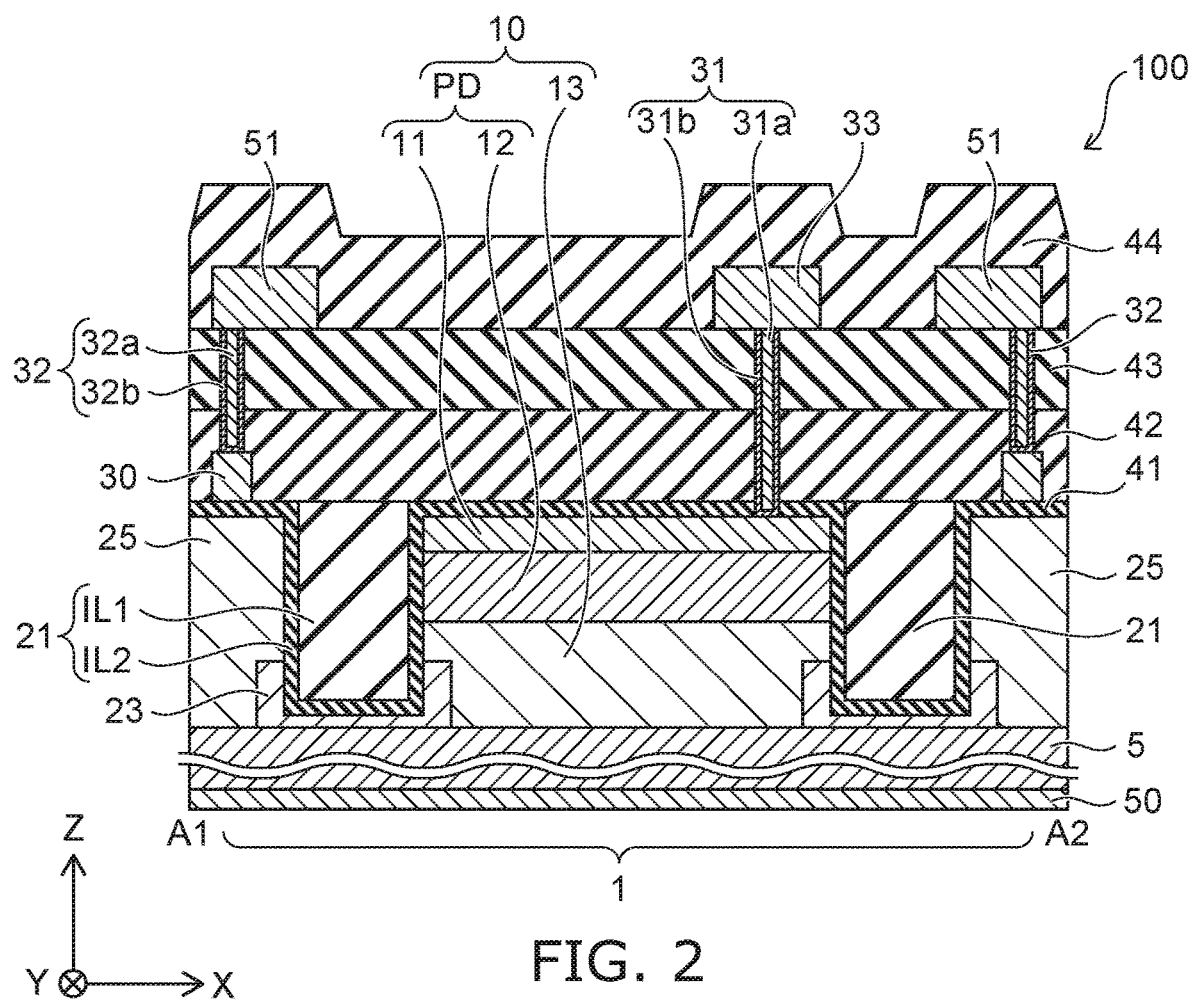
FIG. 2 is an A1-A2 cross-sectional view of FIG. 1.

FIG. 2 is an A1-A2 cross-sectional view of FIG. 1.

Figure 5:
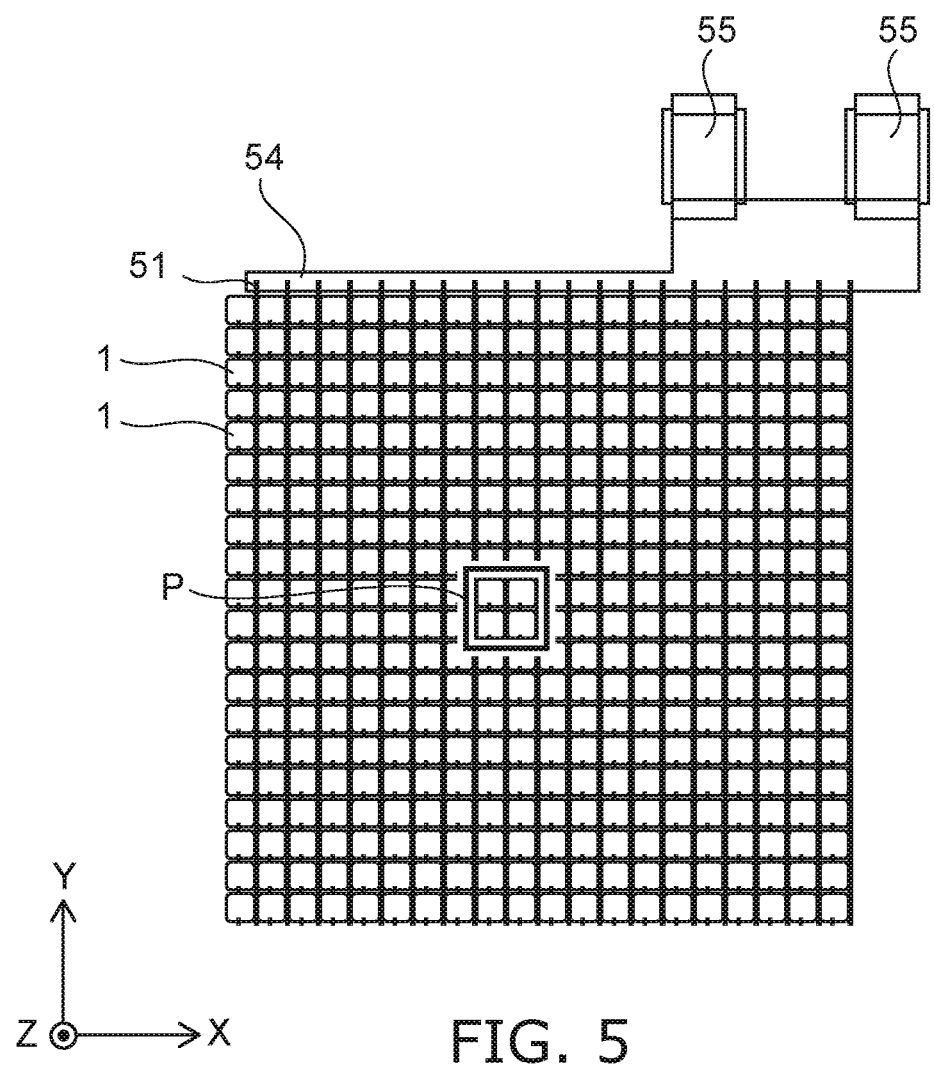
FIG. 5 is a schematic plan view illustrating the light detector according to the first embodiment.

FIG. 5 is a schematic plan view illustrating the light detector according to the first embodiment.

As shown in FIG. 1, the light detector 100 according to the first embodiment includes multiple elements 1. The multiple elements 1 are arranged along a first direction and a second direction that cross each other.

One direction that crosses a plane including the first and second directions is taken as a third direction. For example, the first direction is along an X-direction shown in FIGS. 1 and 2. The second direction is along a Y-direction that is perpendicular to the X-direction. The third direction is along a Z-direction that is perpendicular to the X-direction and the Y-direction. In the description hereinbelow, the first direction, the second direction, and the third direction are respectively along the X-direction, the Y-direction, and the Z-direction.

Each element 1 includes a semiconductor part 10. The semiconductor part 10 includes a first semiconductor layer 11 of a first conductivity type, a second semiconductor layer 12 of a second conductivity type, and a third semiconductor layer 13 of the second conductivity type. The second semiconductor layer 12 is provided between the first semiconductor layer 11 and the third semiconductor layer 13 in the Z-direction. The first semiconductor layer 11 and the second semiconductor layer 12 physically and electrically contact each other and form a photodiode PD.

The first conductivity type is one of a p-type or an n-type. The second conductivity type is the other of the p-type or the n-type. In the description hereinbelow, the first conductivity type is the n-type, and the second conductivity type is the p-type.

The p-type impurity concentration in the third semiconductor layer 13 is less than the p-type impurity concentration in the second semiconductor layer 12. For example, the p-type impurity concentration in the second semiconductor layer 12 is greater than the n-type impurity concentration in the first semiconductor layer 11.

Carriers are generated when light enters the semiconductor part 10. The light detector 100 detects the light entering each semiconductor part 10 as an electrical signal.

As shown in FIG. 2, a conductive layer 5 spreads along the X-direction and the Y-direction and is arranged with the multiple semiconductor parts 10 in the Z-direction. The conductive layer 5 is, for example, a conductive substrate. The conductive layer 5 is provided between an electrode 50 and the multiple semiconductor parts 10. The conductive layer 5 is electrically connected to the electrode 50.

Each semiconductor part 10 is electrically connected to the electrode 50 via the conductive layer 5. A voltage is applied between the first semiconductor layer 11 and the second semiconductor layer 12 by controlling the potential of the electrode 50. For example, each photodiode PD functions as an avalanche photodiode.

At least a portion of the multiple elements 1 further includes a structure body 21. The structure body 21 surrounds the photodiode PD along the X-Y plane. The refractive index of the structure body 21 is different from the refractive index of the photodiode PD (the first semiconductor layer 11 and the second semiconductor layer 12).

Herein, "surround" includes not only the case where an unbroken component continuously surrounds another component, but also includes the case where multiple components are separated from each other and arranged around the other component. For example, the other component can be considered to be surrounded with the multiple components when the other component is positioned inside a path obtained by tracing along the multiple components.

The structure body 21 is insulative. The structure body 21 is provided to suppress conduction and optical interference between the semiconductor parts 10. The movement of secondary photons and carriers between the semiconductor parts 10 is suppressed by the structure body 21. The structure bodies 21 of the elements 1 are separated and do not physically contact each other. For example, the structure body 21 (a first structure body) that surrounds one (a first photodiode) of multiple photodiodes PD is separated from another structure body 21 (a second structure body) that surrounds another one (a second photodiode) of the multiple photodiodes PD. The first structure body and the second structure body are adjacent to each other in the X-direction or the Y-direction. For example, a semiconductor region 25 is provided between these structure bodies, and the semiconductor region 25 contacts the first and second structure bodies.

A p-type semiconductor region 23 may be provided between the conductive layer 5 and the structure body 21 in the Z-direction. The p-type impurity concentration in the semiconductor region 23 is greater than the p-type impurity concentration in the third semiconductor layer 13.

For example, the first semiconductor layer 11 and the second semiconductor layer 12 contact the structure body 21. Thereby, the photon detection efficiency can be greater than when the first semiconductor layer 11 and the second semiconductor layer 12 are separated from the structure body 21.

The semiconductor region 25 is provided between mutually-adjacent elements 1. For example, the semiconductor region 25 extends in the Y-direction between elements 1 that are adjacent to each other in the X-direction. The semiconductor region 25 extends in the X-direction between elements 1 that are adjacent to each other in the Y-direction. For example, the semiconductor region 25 contacts the structure body 21.

Each element 1 includes a quenching part. In the example, a quenching resistance 30 is provided as the quenching part. The quenching resistance 30 is electrically connected to the first semiconductor layer 11 of each photodiode PD. For example, the quenching resistance 30 exists at a different position from the photodiode PD when viewed from the Z-direction. For example, the quenching resistance 30 is arranged with the structure body 21 or the semiconductor region 25 in the Z-direction. The other end of the quenching resistance 30 is electrically connected to a first interconnect 51.

The quenching resistance 30 is electrically connected to the first semiconductor layer 11 via a contact 31 and a connection interconnect 33 and is electrically connected to the first interconnect 51 via the contact 32. For example, the position in the Z-direction of the quenching resistance 30 is between the position in the Z-direction of the first semiconductor layer 11 and the position in the Z-direction of the first interconnect 51. One first interconnect 51 is electrically connected to multiple photodiodes PD arranged in the Y-direction.

The electrical resistance of the quenching resistance 30 is greater than the electrical resistances of the contact 31, the contact 32, and the connection interconnect 33. It is favorable for the electrical resistance of the quenching resistance 30 to be not less than 50 kΩ and not more than 2 MΩ.

The quenching resistance 30 is provided to suppress the continuation of avalanche breakdown when light enters the semiconductor part 10 and avalanche breakdown occurs. A voltage drop that corresponds to the electrical resistance of the quenching resistance 30 occurs when avalanche breakdown occurs and a current flows in the quenching resistance 30. The potential difference between the first semiconductor layer 11 and the second semiconductor layer 12 is reduced by the voltage drop, and the avalanche breakdown stops. The next light that is incident on the semiconductor part 10 can be detected thereby.

Thus, the quenching resistance 30 that generates a large voltage drop may be provided; conversely, instead of a resistor, a control circuit that blocks the current may be provided as the quenching part. For example, the control circuit may include a comparator, a control logic part, and two switching elements. A known configuration called an active quenching circuit is applicable to the control circuit.

For example, the photodiode PD operates in a Geiger mode when a reverse voltage that is greater than the breakdown voltage is applied to the photodiode PD. By operating in the Geiger mode, it is possible to output a pulse signal having a high gain and a short time constant, and the light detector can have a wide dynamic range from one photon.

The light detector 100 includes, for example, insulating layers 41 to 44. The insulating layers 41 to 43 are provided between the insulating layer 44 and the multiple elements 1 in the Z-direction. The insulating layers 41 and 42 are provided between the insulating layer 43 and the multiple elements 1 in the Z-direction. The insulating layer 41 is provided between the insulating layer 42 and the multiple elements 1 in the Z-direction.

The contacts 31 and 32 are surrounded with the insulating layers 41, 42, and 43 along the X-Y plane. A portion of the insulating layer 41 is provided between the semiconductor region 25 and the quenching resistance 30 in the Z-direction. The first interconnect 51 and the connection interconnect 33 are surrounded with the insulating layer 44. The insulating layers 41 to 44 are not illustrated in FIG. 1. As shown in FIG. 5, the light detector 100 further includes a common line 54 and a pad 55. FIG. 1 shows a portion P shown in FIG. 5. One first interconnect 51 is electrically connected to multiple elements 1 arranged in the Y-direction. Multiple first interconnects 51 that are arranged in the X-direction are electrically connected to the common line 54. The common line 54 is electrically connected to one or more pads 55. Wiring of an external device is electrically connected to the pad 55.

Figure 3:
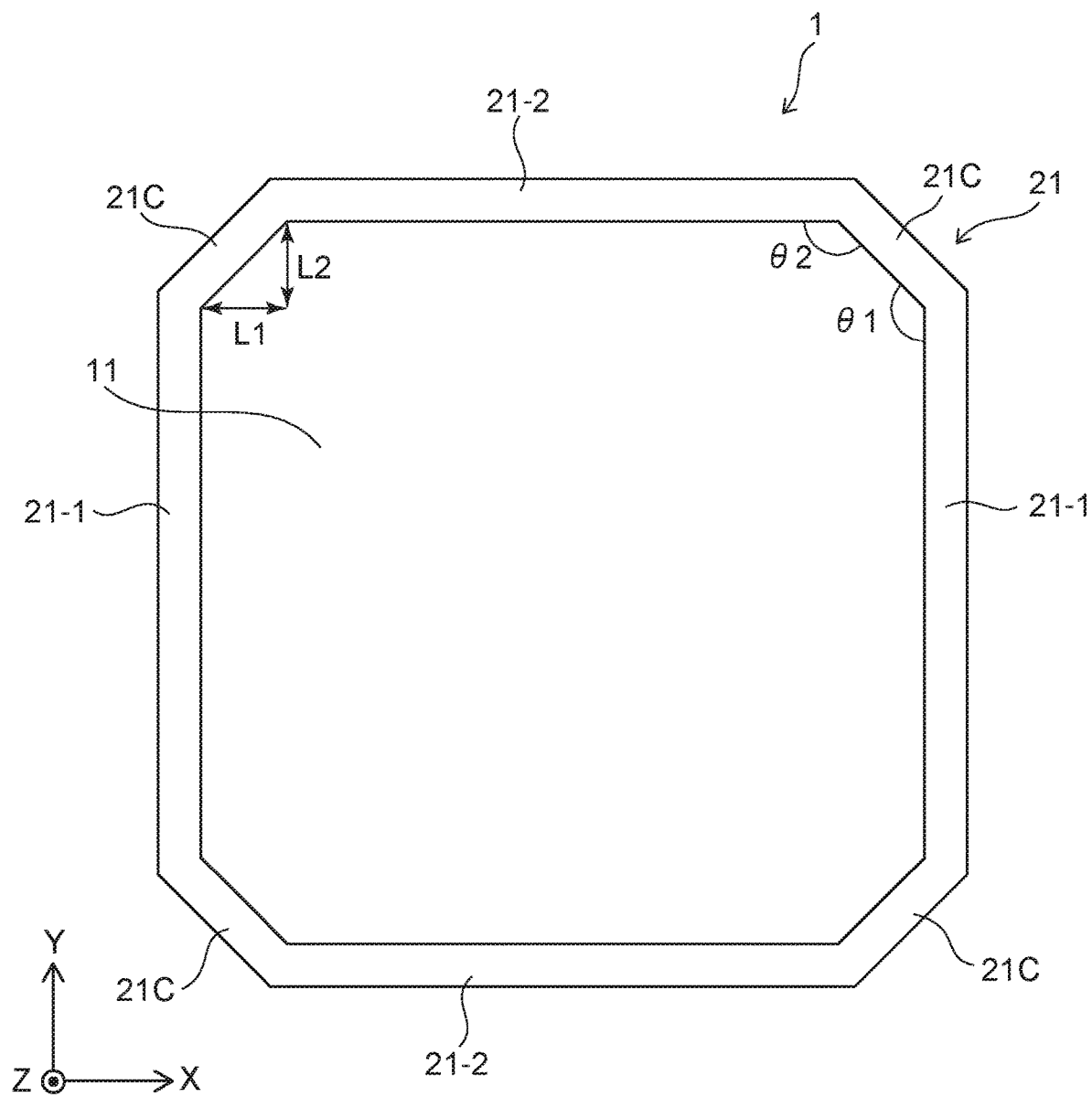
FIGS. 3 and 4 are plan views illustrating a portion of the light detector according to the first embodiment.
Figure 4:
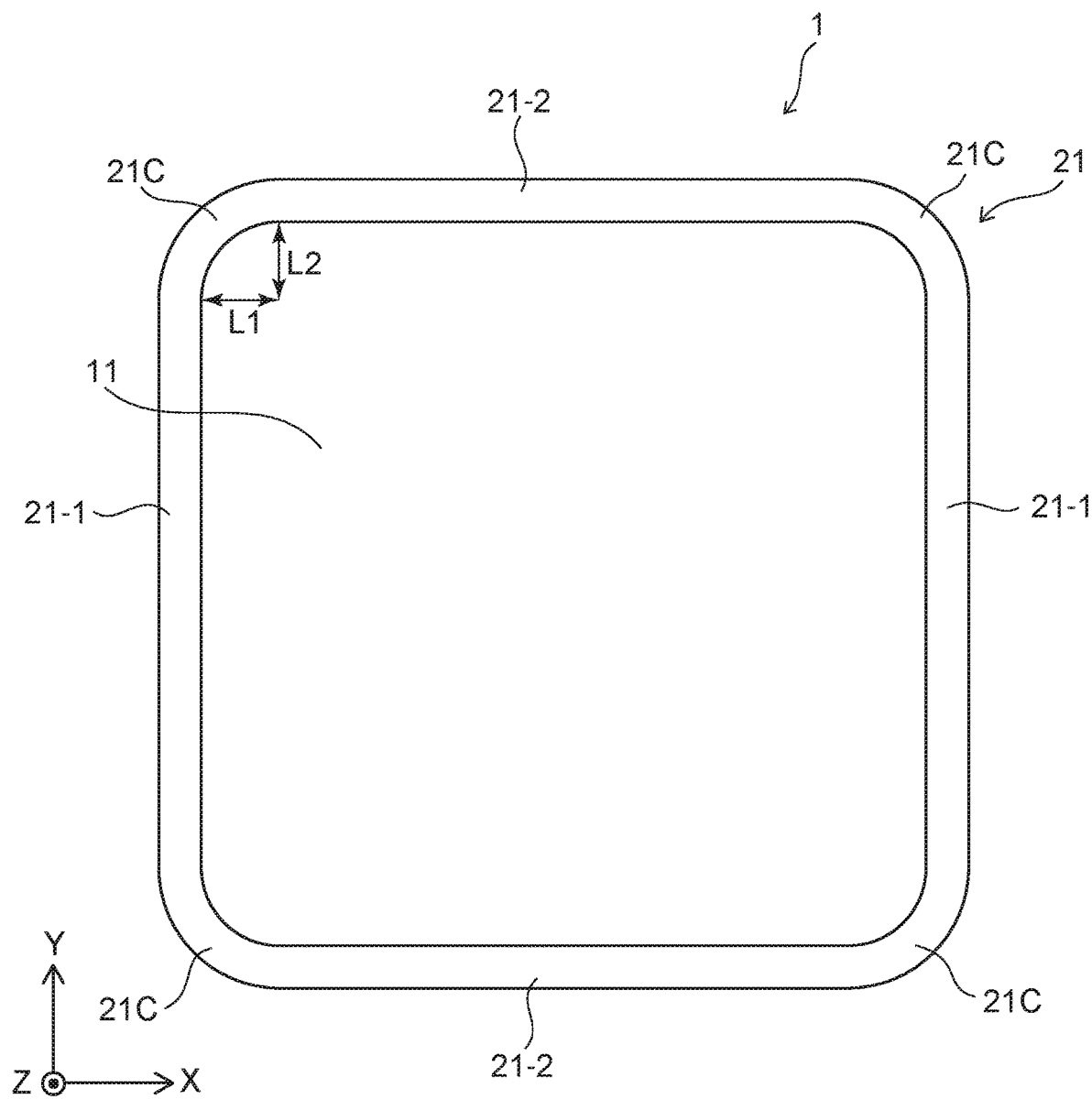

FIGS. 3 and 4 are plan views illustrating a portion of the light detector according to the first embodiment.

As shown in FIG. 3, the structure body 21 is a five-or-higher-sided polygon when viewed from the Z-direction. In the example of FIG. 3, the structure body 21 is an octagon when viewed from the Z-direction. For example, the structure body 21 may include a pair of first extension portions 21-1 extending in the Y-direction, a pair of second extension portions 21-2 extending in the X-direction, and multiple link portions 21C. The first semiconductor layer 11 (the photodiode PD) is provided between the pair of first extension portions 21-1 in the X-direction. The first semiconductor layer 11 is provided between the pair of second extension portions 21-2 in the Y-direction. Each link portion 21C links one end of the first extension portion 21-1 and one end of the second extension portion 21-2.

The length in the Y-direction of the first extension portion 21-1 is greater than the length in the Y-direction of the link portion 21C. The length in the X-direction of the second extension portion 21-2 is greater than the length in the X-direction of the link portion 21C. For example, when viewed from the Z-direction, the link portion 21C has a straight-line shape, and the structure body 21 is an octagon. It is favorable for the shape of the structure body 21 to have eight or more sides when viewed from the Z-direction. In other words, it is favorable for an angle θ1 between the first extension portion 21-1 and the link portion 21C to be 135 degrees or more. It is favorable for an angle θ2 between the second extension portion 21-2 and the link portion 21C to be 135 degrees or more.

It is favorable for a length L1 in the X-direction of the link portion 21C and a length L2 in the Y-direction of the link portion 21C each to be 1 μm or more.

Or, as shown in FIG. 4, the structure body 21 may be a polygon having curved vertices when viewed from the Z-direction. In other words, the link portions 21C may be curved when viewed from the Z-direction. In the example of FIG. 4, the structure body 21 is a rounded rectangle when viewed from the Z-direction. For example, one end of the link portion 21C that is linked to the first extension portion 21-1 is along the Y-direction. The other end of the link portion 21C that is linked to the second extension portion 21-2 is along the X-direction. Thereby, the link portion 21C is smoothly linked to the first extension portion 21-1 and the second extension portion 21-2. Similarly, the link portion 21C may be curved when viewed from the Z-direction.

The structure of the light detector 100 is not limited to the illustrated examples, and various modifications are possible. For example, the shape of the structure body 21 (the first structure body) surrounding one (the first photodiode) of the multiple photodiodes PD may be different from the shape of the other structure body 21 (the second structure body) surrounding another one (the second photodiode) of the multiple photodiodes PD when viewed from the Z-direction. For example, it is easy to arrange the quenching resistance 30, the first interconnect 51, etc., by changing the shape of the structure body 21 according to the arrangement of the quenching resistance 30, the first interconnect 51, etc. The shape of the first photodiode may be different from the shape of the second photodiode when viewed from the Z-direction. The surface area of the first photodiode may be different from the surface area of the second photodiode when viewed from the Z-direction. The electrical resistance of the quenching resistance 30 electrically connected to the first photodiode and the electrical resistance of the quenching resistance 30 electrically connected to the second photodiode may be different from each other. Mutually-different operating voltages may be applied to the first interconnect 51 electrically connected to the first photodiode and the first interconnect 51 electrically connected to the second photodiode. The signal of the first interconnect 51 electrically connected to the first photodiode and the signal of the first interconnect 51 electrically connected to the second photodiode may be separately read. The electrical resistance of the quenching resistance 30 electrically connected to the first photodiode and the electrical resistance of the quenching resistance 30 electrically connected to the second photodiode may be different from each other.

Examples of materials of the components will now be described.

The first semiconductor layer 11, the second semiconductor layer 12, the third semiconductor layer 13, and the semiconductor region 25 include at least one semiconductor material selected from the group consisting of silicon, silicon carbide, gallium arsenide, and gallium nitride. Phosphorus, arsenic, or antimony may be used as the n-type impurity when these semiconductor regions include silicon. Boron may be used as the p-type impurity.

The n-type impurity concentration in the first semiconductor layer 11 is, for example, not less than $1.0 \times 10^{18}$ atoms/cm$^3$ and not more than $1.0 \times 10^{21}$ atoms/cm$^3$. By setting this concentration range, the electrical resistance of the first semiconductor layer 11 can be reduced, and the loss of the carriers in the second semiconductor layer 12 can be reduced.

The p-type impurity concentration in the second semiconductor layer 12 is, for example, not less than $1.0 \times 10^{16}$ atoms/cm$^3$ and not more than $1.0 \times 10^{18}$ atoms/cm$^3$. By setting this concentration range, the second semiconductor layer 12 can have a p-n junction with the first semiconductor layer 11, and a depletion layer can easily spread in the second semiconductor layer 12.

The p-type impurity concentration in the third semiconductor layer 13 is, for example, not less than $1.0 \times 10^{13}$ atoms/cm$^3$ and not more than $1.0 \times 10^{16}$ atoms/cm$^3$. By setting this concentration range, a depletion layer can sufficiently spread in the third semiconductor layer 13, and the photon detection efficiency or the light-receiving sensitivity can be increased.

The conductive layer 5 is, for example, a p-type semiconductor layer. The conductive layer 5 includes the semiconductor material described above. The p-type impurity concentration in the conductive layer 5 is not less than $1.0 \times 10^{17}$ atoms/cm$^3$ and not more than $1.0 \times 10^{21}$ atoms/cm$^3$.

The conductive layer 5 may include a metal. For example, the conductive layer 5 includes at least one selected from the group consisting of aluminum, copper, titanium, gold, and nickel.

The structure body 21 includes an insulating material. For example, the structure body 21 includes silicon and one selected from the group consisting of oxygen and nitrogen. For example, the structure body 21 includes silicon oxide or silicon nitride. As shown in FIG. 2, the structure body 21 may include a first insulating layer IL1 and a second insulating layer IL2. The second insulating layer IL2 is provided between the first insulating layer IL1 and the semiconductor part 10 and between the first insulating layer IL1 and the conductive layer 5. For example, the first insulating layer IL1 and the second insulating layer IL2 include silicon oxide, and the second insulating layer IL2 has a dense structure compared to the first insulating layer IL1.

The quenching resistance 30 includes polysilicon as a semiconductor material. An n-type impurity or a p-type impurity may be added to the quenching resistance 30.

The contacts 31 and 32 include a metal material. For example, the contacts 31 and 32 include at least one selected from the group consisting of titanium, tungsten, copper, and aluminum. The contacts 31 and 32 may include a conductive body made of a nitride or a silicon compound of at least one selected from the group consisting of titanium, tungsten, copper, and aluminum. As shown in FIG. 2, the contact 31 may include a metal layer 31a and a metal layer 31b. The contact 32 may include a metal layer 32a and a metal layer 32b. The metal layer 31b is provided between the metal layer 31a and the insulating layer 41, between the metal layer 31a and the insulating layer 42, and between the metal layer 31a and the insulating layer 43. The metal layer 32b is provided between the metal layer 32a and the insulating layer 42 and between the metal layer 32a and the insulating layer 43. For example, the metal layers 31a and 32a include tungsten. The metal layers 31b and 32b include titanium. The metal layer 31b may include a titanium layer, and a titanium nitride layer provided between the titanium layer and the metal layer 31a. The metal layer 32b may include a titanium layer, and a titanium nitride layer provided between the titanium layer and the metal layer 32a.

The connection interconnect 33, the electrode 50, and the first interconnect 51 include at least one selected from the group consisting of copper and aluminum. The insulating layers 41 to 44 include an insulating material. For example, the insulating layers 41 to 44 include silicon and one selected from the group consisting of oxygen and nitrogen. For example, the insulating layers 41 to 44 include silicon oxide.

FIGS. 6A to 19 are schematic views illustrating manufacturing processes of the light detector according to the first embodiment.

FIGS. 6A to 18A respectively show B1-B2 cross sections of FIGS. 6B to 18B. An example of the manufacturing processes of the light detector according to the first embodiment will be described with reference to FIGS. 6A to 19.

Figures 6A, 6B:
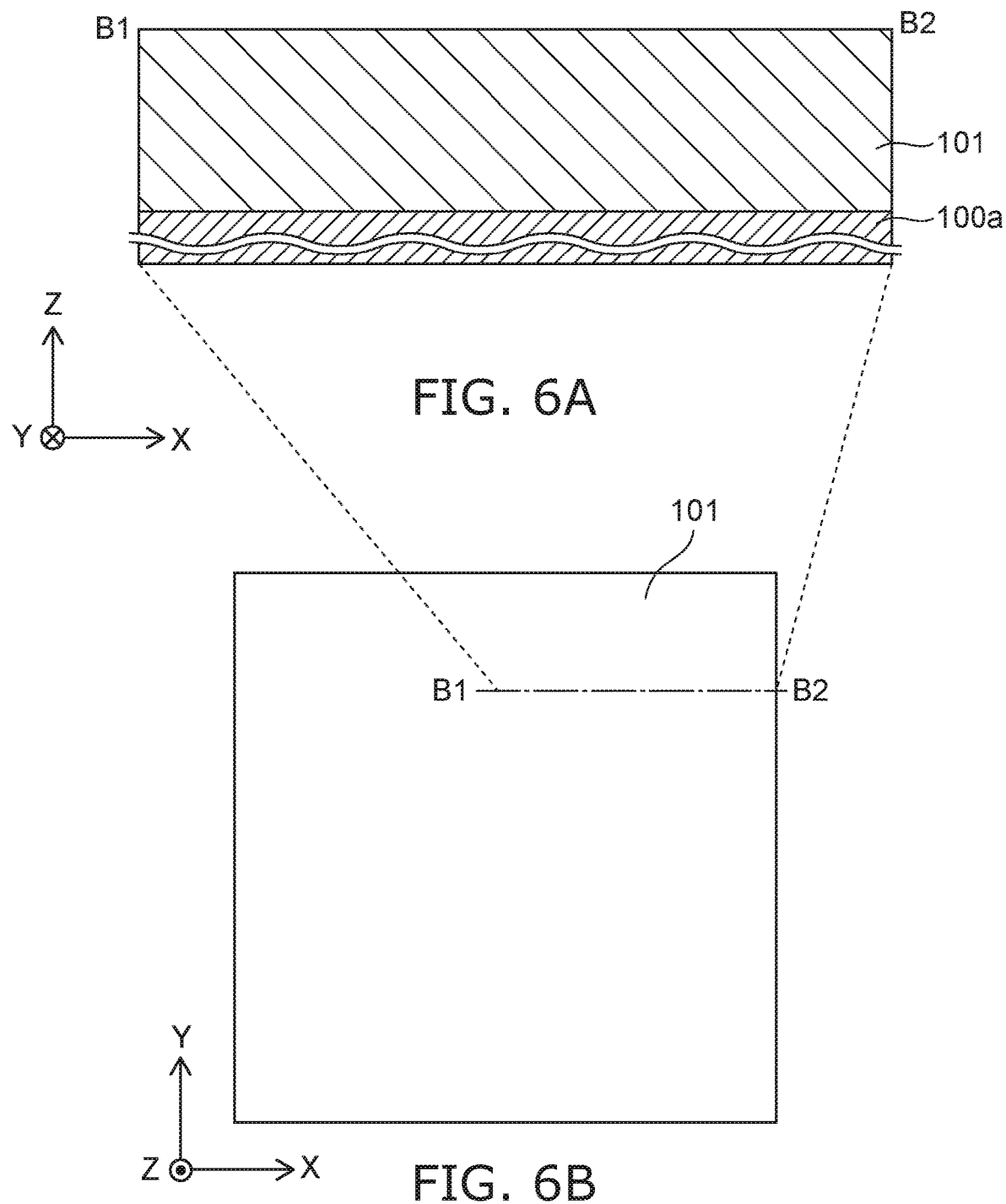
FIGS. 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, and 19 are schematic views illustrating manufacturing processes of the light detector according to the first embodiment.

As shown in FIGS. 6A and 6B, a substrate that includes a silicon substrate 100a and a silicon epitaxial layer 101 is prepared. The silicon epitaxial layer 101 is formed by epitaxially growing silicon on the silicon substrate 100a. The silicon substrate 100a and the silicon epitaxial layer 101 include single-crystal p-type silicon doped with boron. The boron concentration in the silicon substrate 100a is $4.0 \times 10^{18}$ $cm^{-3}$. The boron concentration in the silicon epitaxial layer 101 is $1.0 \times 10^{15}$ $cm^{-3}$. The thickness of the silicon epitaxial layer 101 is 10 μm.

Figure 7A:
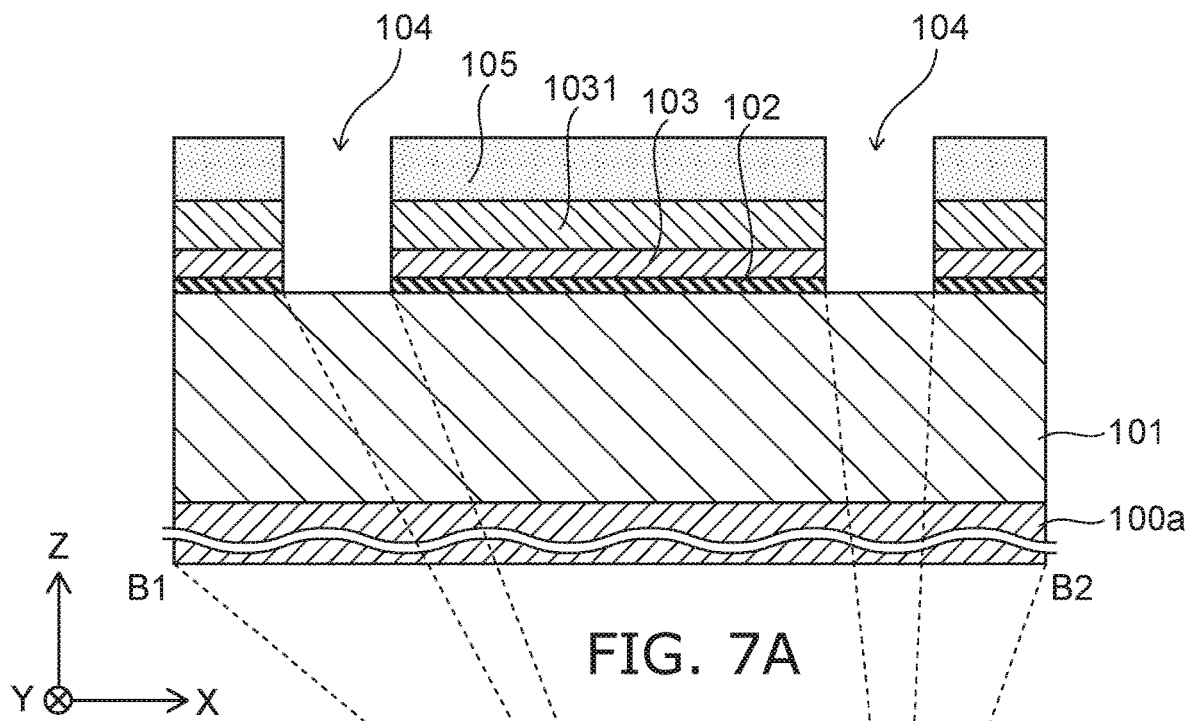
Figure 7B:
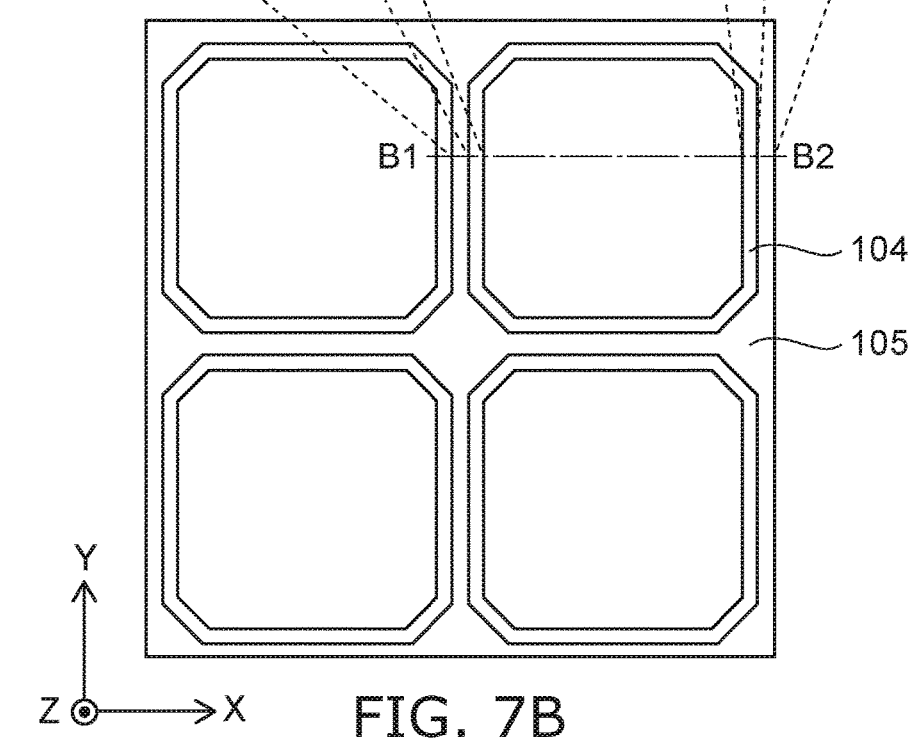

As shown in FIGS. 7A and 7B, a silicon oxide film 102 that has a thickness of 100 nm is formed by oxidizing the surface of the silicon epitaxial layer 101. A silicon nitride film 103 of 150 nm is deposited on the silicon oxide film 102 by low pressure thermal CVD. 1000 nm of a silicon oxide film 1031 is deposited on the silicon nitride film 103 by low pressure thermal CVD. A resist 105 that defines an element separation region 104 is formed by a lithography process. The silicon oxide film 1031, the silicon nitride film 103, and the silicon oxide film 102 are etched via an opening of the resist 105 by reactive ion etching (RIE). The width of the element separation region 104 is 1.8 μm.

Figure 8A:
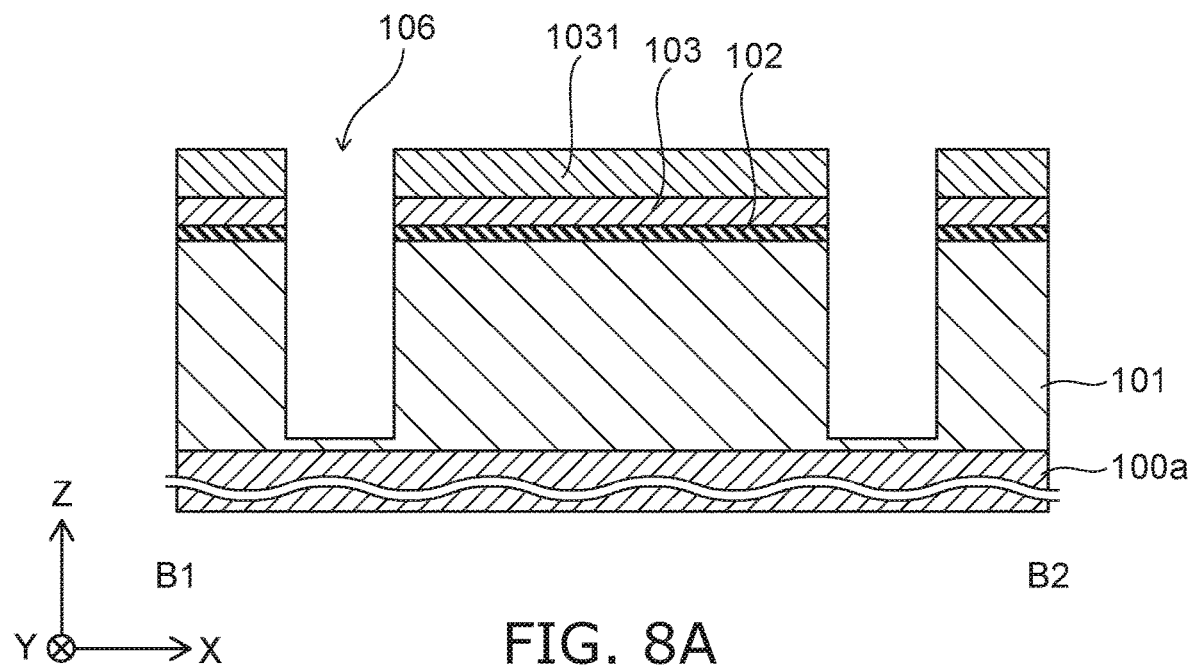
Figure 8B:
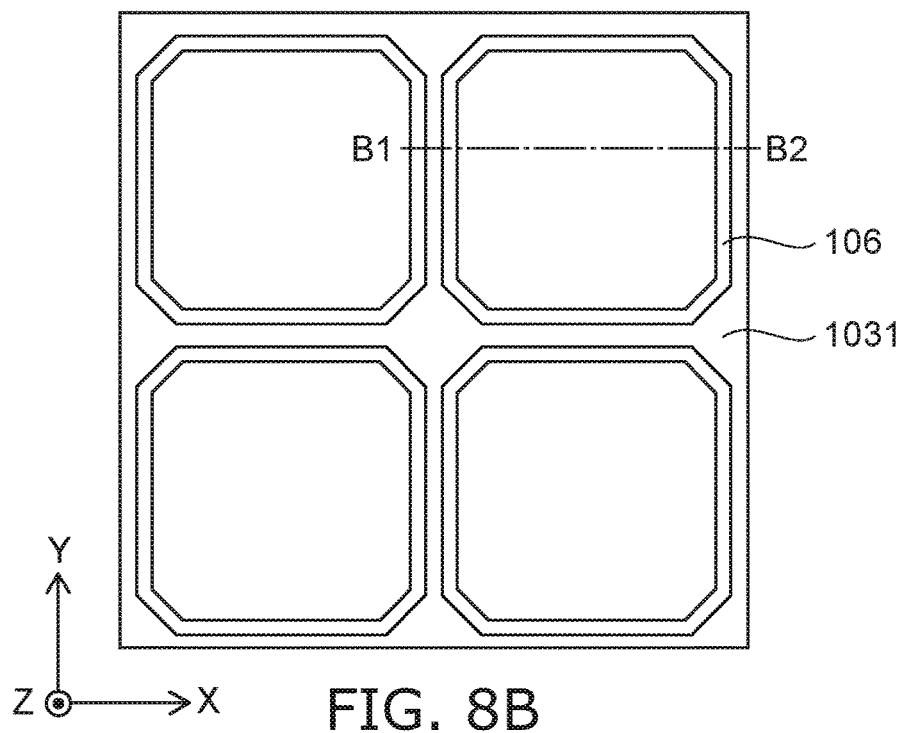

The resist 105 is stripped away as shown in FIGS. 8A and 8B. The silicon epitaxial layer 101 of the element separation region 104 is etched using the silicon oxide film 1031 as a mask. A first trench 106 is formed thereby. At this time, the depth of the etching is determined by the thickness of the silicon epitaxial layer 101 and the diffusion amount into the silicon epitaxial layer 101 of the boron included in the silicon substrate 100a. The diffusion amount is determined by considering the heating processes of the entire process. The etching depth is, for example, 9 μm. It is favorable to provide a taper angle of about 2° when forming the first trench 106. The taper angle is the tilt of the side surface of the first trench 106 with respect to the Z-direction. The occurrence of voids when subsequently filling with an oxide film can be suppressed thereby.

Figure 9A:
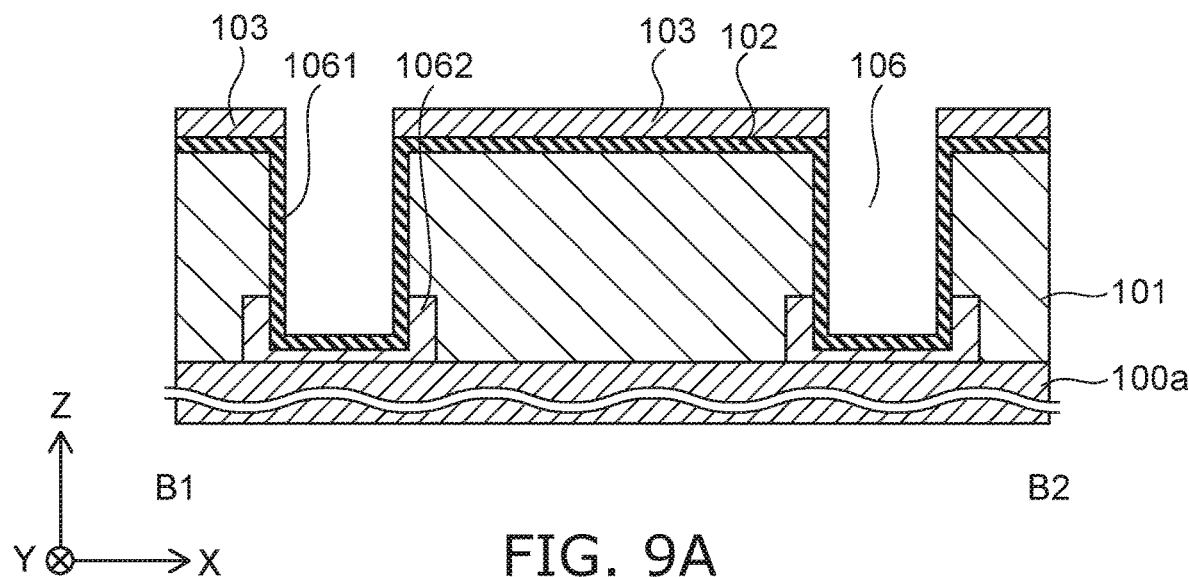
Figure 9B:
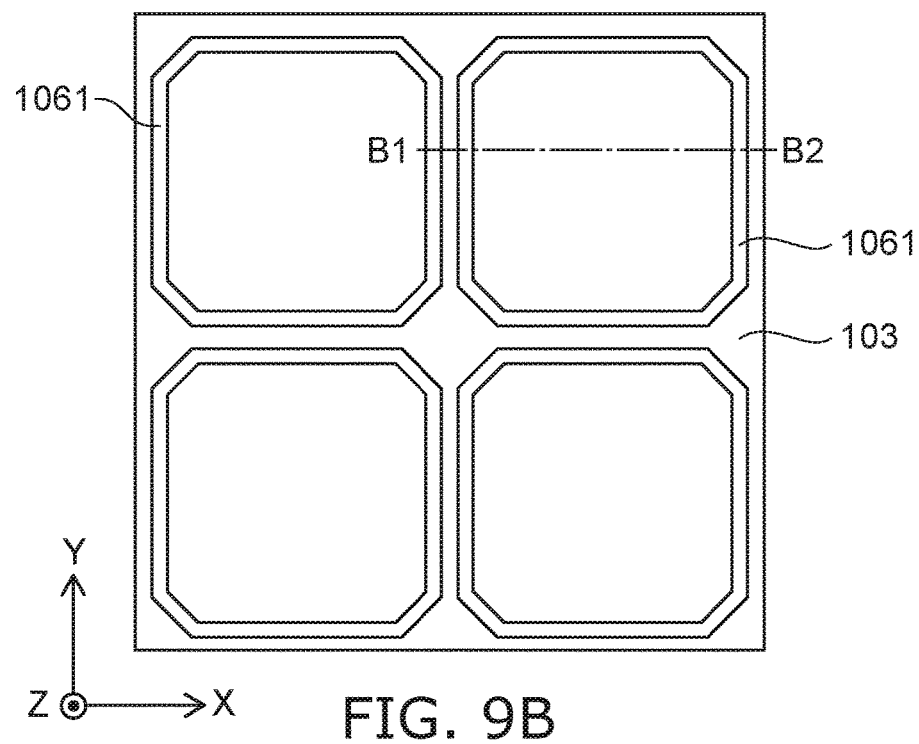

As shown in FIGS. 9A and 9B, a silicon oxide film 1061 that has a thickness of 50 nm is formed by oxidizing the surface of the first trench 106. An implantation region 1062 may be formed at the bottom portion of the first trench 106 by performing ion implantation into the entire substrate surface. The implantation region 1062 is formed by ion implantation of boron with an implantation acceleration voltage of 40 keV, an implantation dose of $3.0 \times 10^{12}$ $cm^{-2}$, and an angle from the substrate normal direction of 0 degrees. If the angle is set to ±30 degrees at this time, the implantation region 1062 can be formed also at the bottom portion side surface of the first trench 106 as shown in FIG. 9A. Crystal defects occur in the silicon epitaxial layer 101 when forming the first trench 106 by RIE. A noise component caused by the defects can be suppressed by forming the implantation region 1062 at the bottom portion side surface of the first trench 106.

Figure 10A:
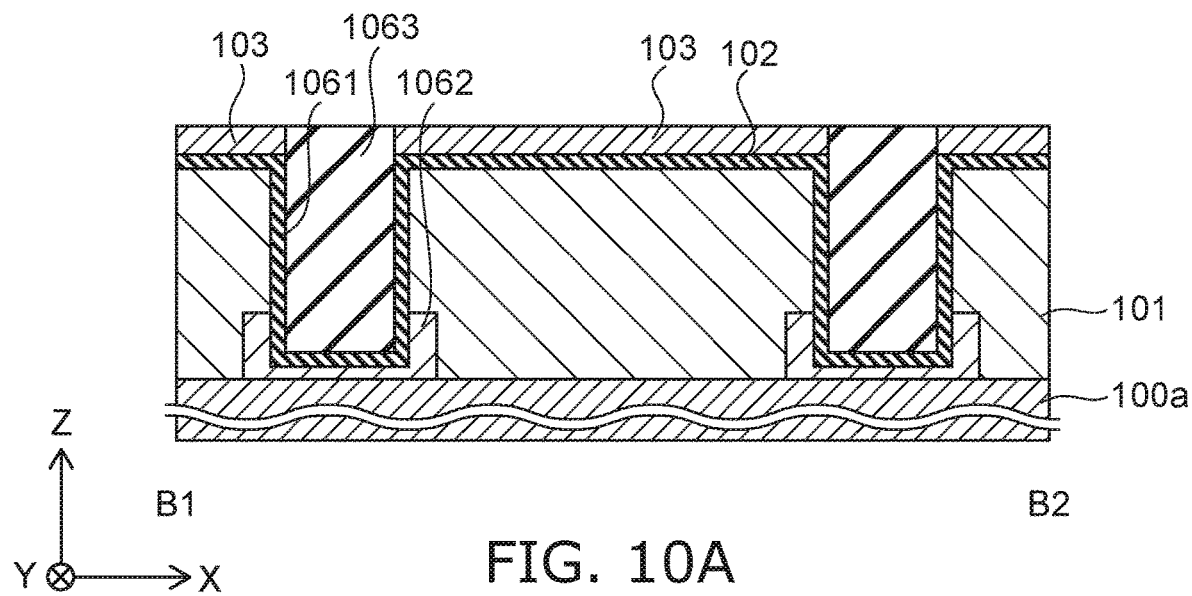
Figure 10B:
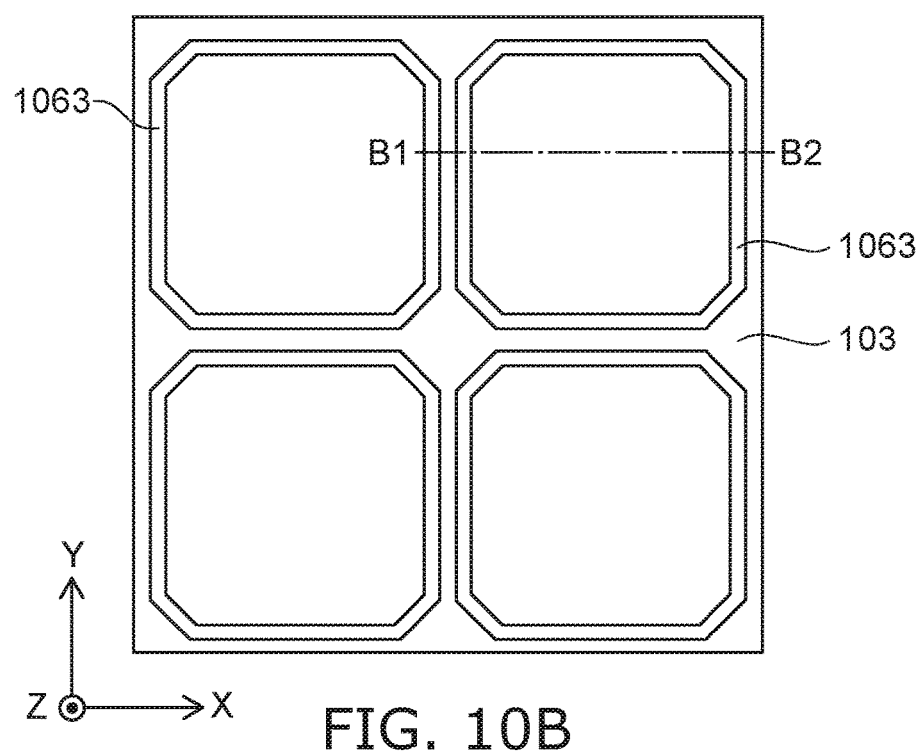

As shown in FIGS. 10A and 10B, 1.2 μm of a buried oxide film 1063 is deposited by plasma-enhanced chemical vapor deposition (CVD). The structure of the buried oxide film 1063 is densified by performing nitrogen annealing at 1000° C. The buried oxide film 1063 is planarized by chemical mechanical polishing (CMP) processing using the silicon nitride film 103 as a stopper.

Figure 11A:
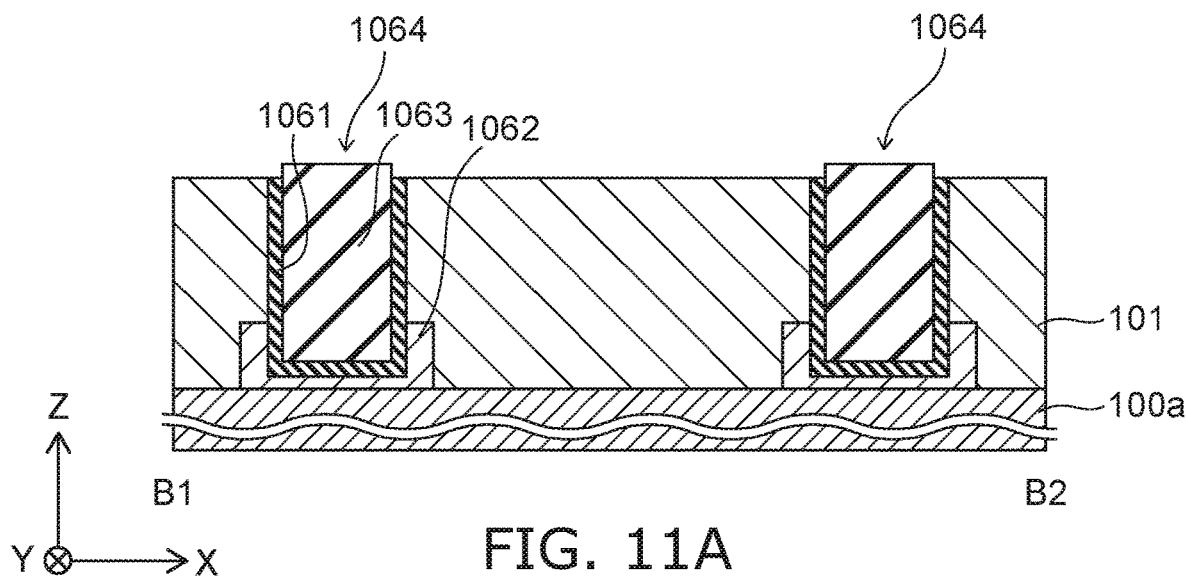
Figure 11B:
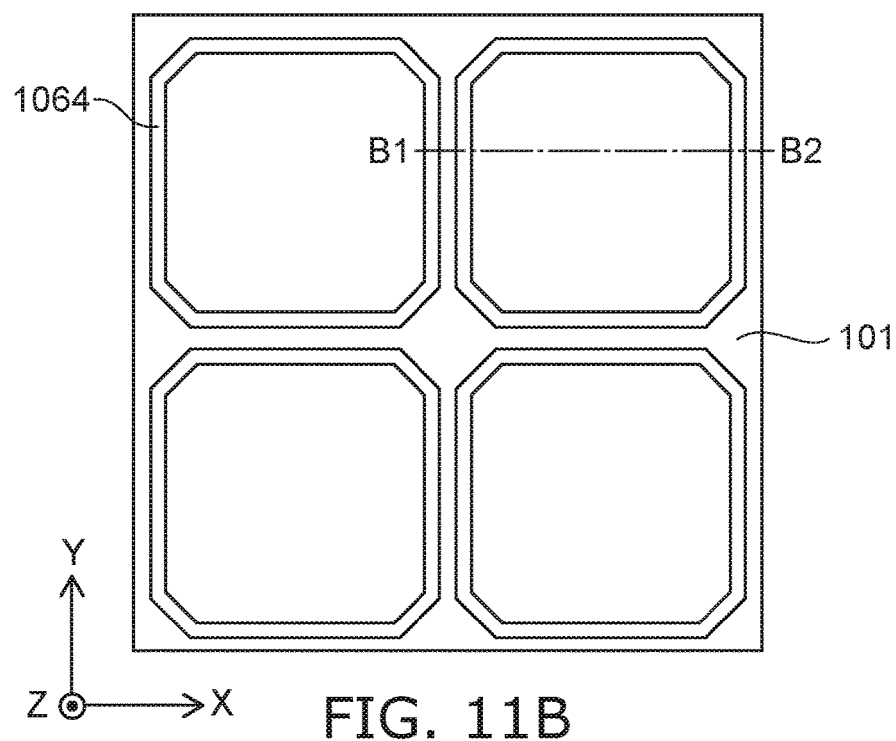

As shown in FIGS. 11A and 11B, the silicon oxide film 1031 that is on the silicon nitride film 103 is removed by hydrofluoric acid treatment. The silicon nitride film 103 is stripped away by hot phosphoric acid treatment. The silicon oxide film 102 is stripped away by hydrofluoric acid treatment. Thus, a first separation structure 1064 that is deeper than a second separation structure described below is formed.

Figure 12A:
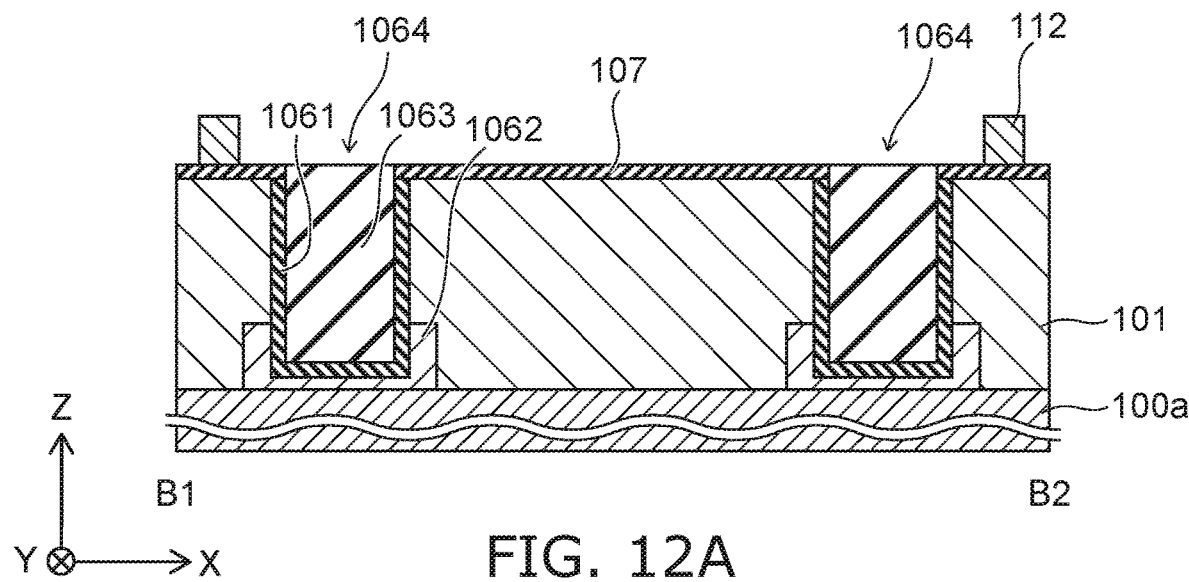
Figure 12B:
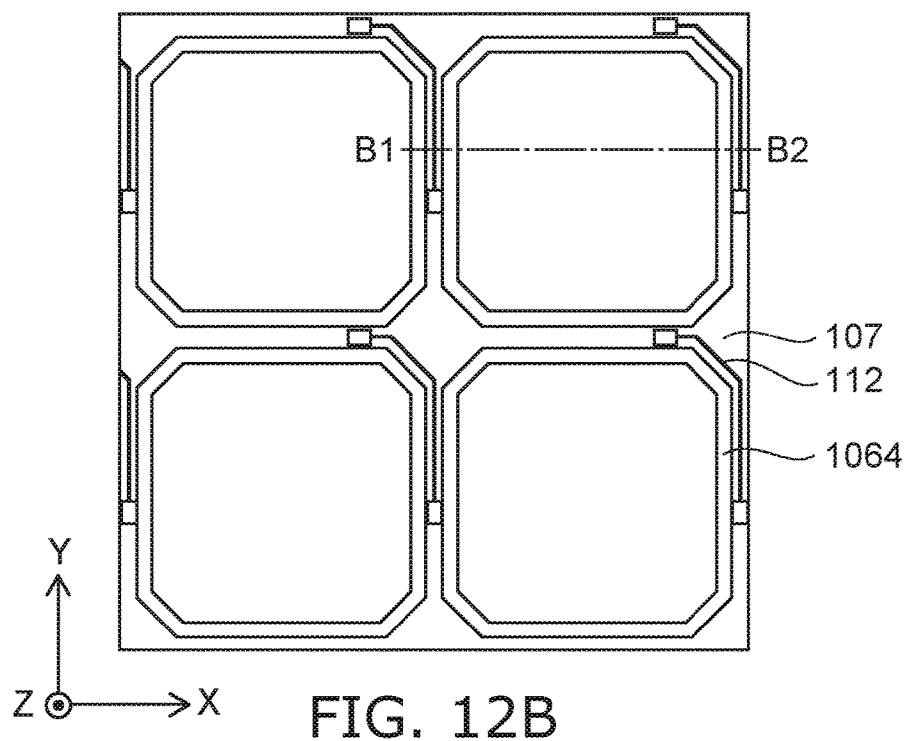

As shown in FIGS. 12A and 12B, a silicon oxide film 107 that has a thickness of 50 nm is formed by oxidizing the surface of the p-type silicon epitaxial layer 101. A polysilicon film that has a thickness of 0.2 μm is formed by low pressure thermal CVD. A quenching resistance 112 is formed by patterning the silicon oxide film 107 and the polysilicon film into a prescribed shape by a lithography process and an RIE process. To adjust the resistance of the quenching resistance 112, for example, $1.0 \times 10^{15}$ $cm^{-2}$ of an impurity is implanted by implanting boron with an implantation acceleration voltage of 20 keV and by performing an activation anneal.

Figure 13A:
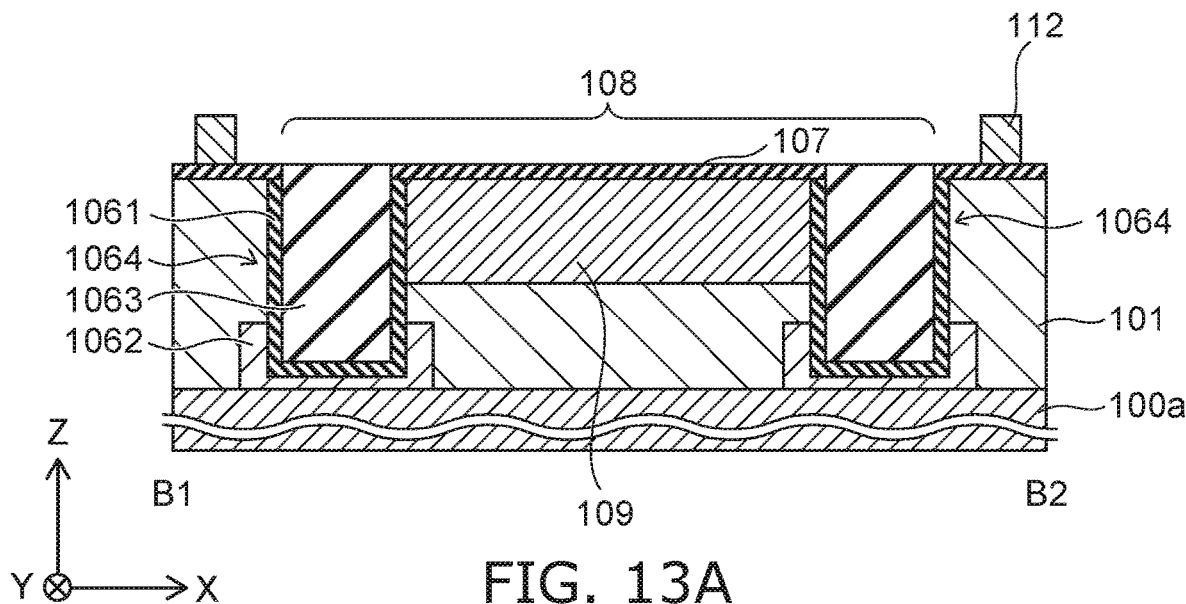
Figure 13B:
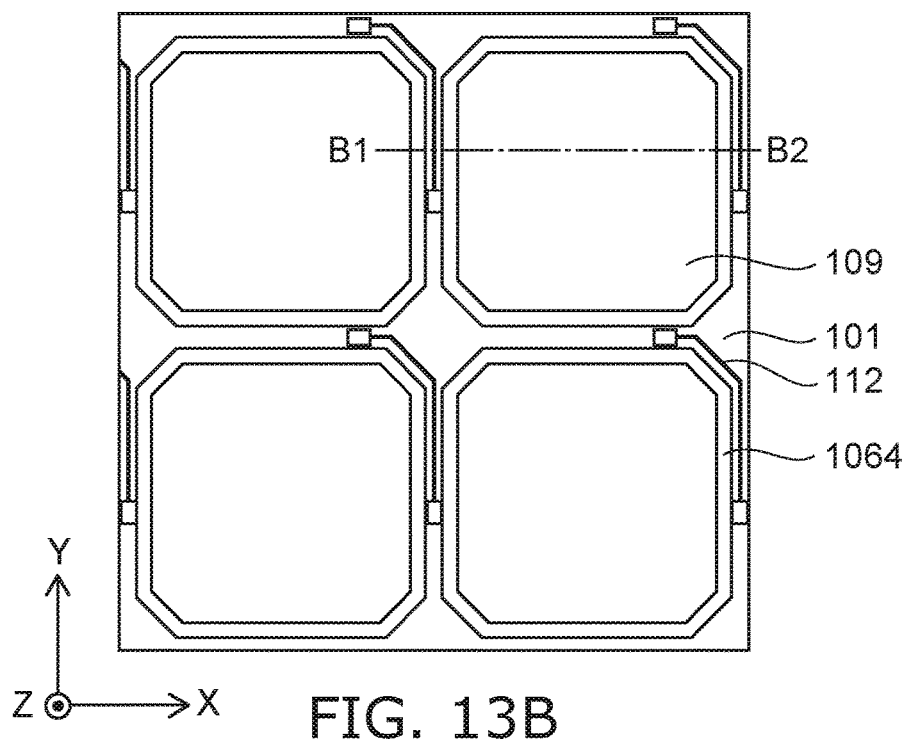

As shown in FIGS. 13A and 13B, a p-type avalanche layer 109 is formed in an element region 108 by a lithography process and an ion implantation process. The silicon oxide film 107 is not illustrated in FIGS. 13B to 18B. The p-type avalanche layer 109 is formed by ion implantation of boron. The p-type avalanche layer 109 is formed so that the boron has a peak depth of 0.8 μm and a peak concentration of $1.0 \times 10^{17}$ $cm^{-3}$.

Figure 14A:
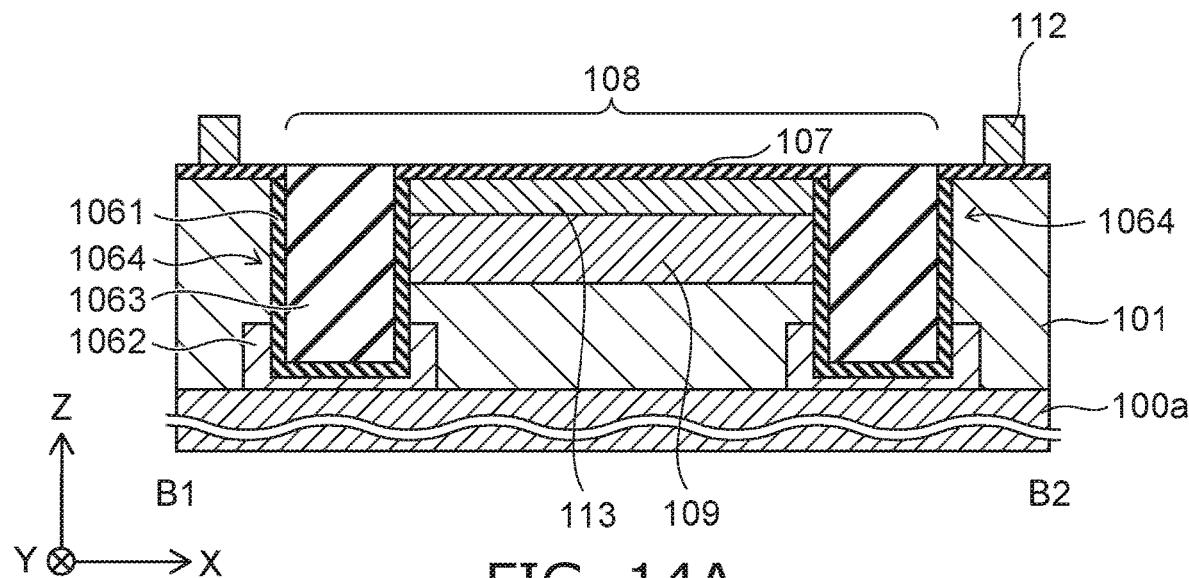
Figure 14B:
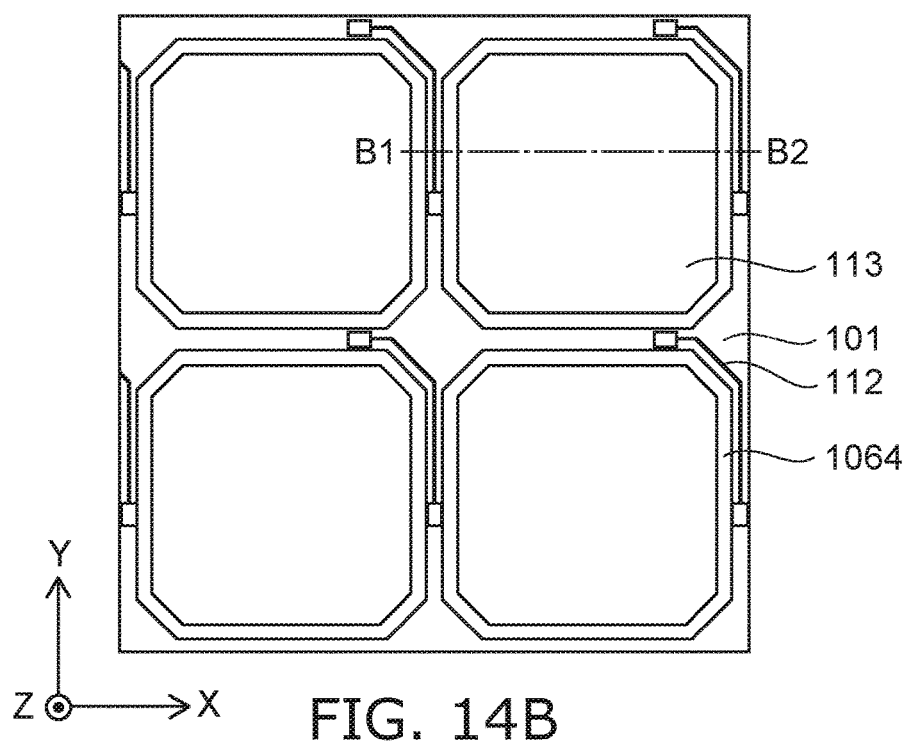

As shown in FIGS. 14A and 14B, an n-type avalanche layer 113 is formed in the element region 108 by a lithography process and an ion implantation process. The n-type avalanche layer 113 also is used as an ohmic electrode portion between the semiconductor layer and the interconnect, which includes a metal. The n-type avalanche layer 113 is formed by ion implantation of phosphorus. The n-type avalanche layer 113 is formed so that the phosphorus has a peak positioned at the surface of the substrate and a peak concentration of $1.5 \times 10^{20}$ $cm^{-3}$. Annealing is performed in a $N_2$ atmosphere to activate the n-type avalanche layer 113.

Figure 15A:
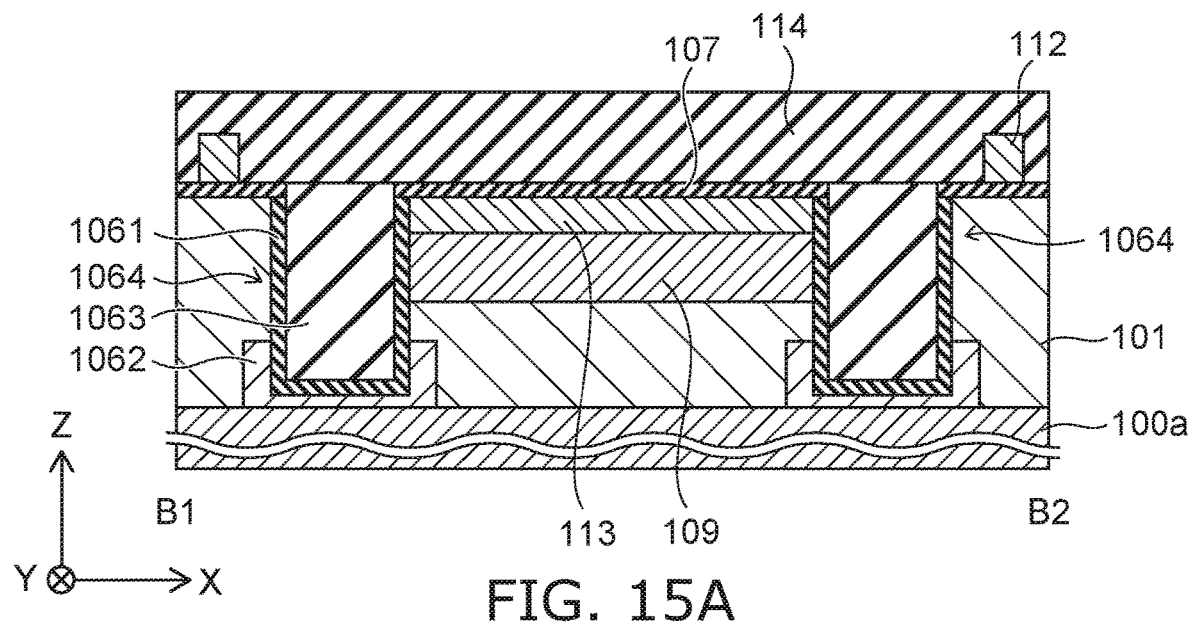
Figure 15B:
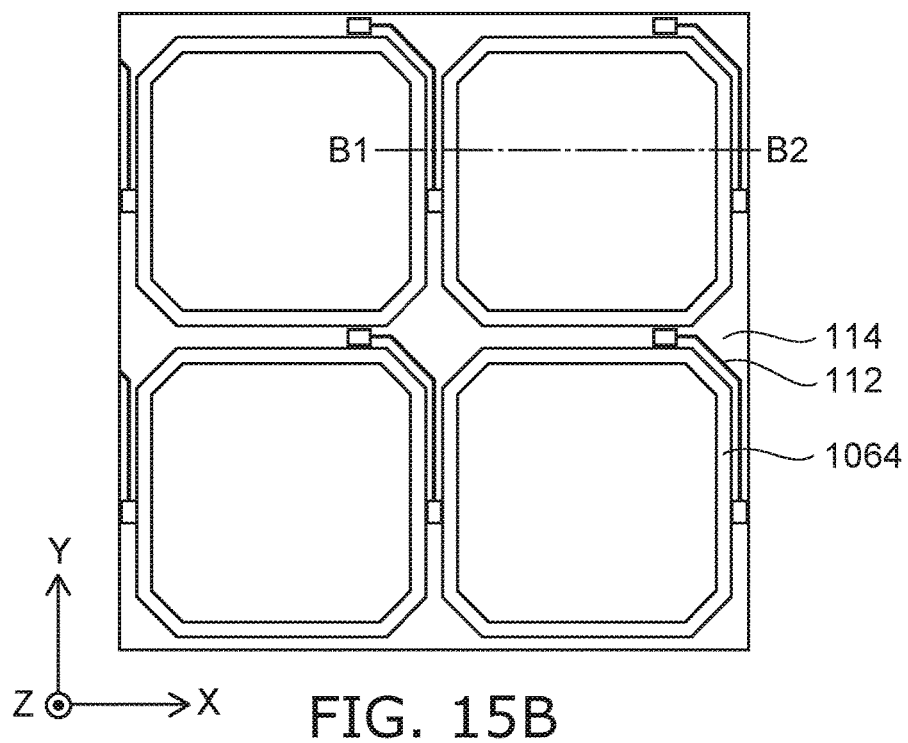

As shown in FIGS. 15A and 15B, 0.5 μm of an insulating film 114 is formed by CVD.

Figure 16A:
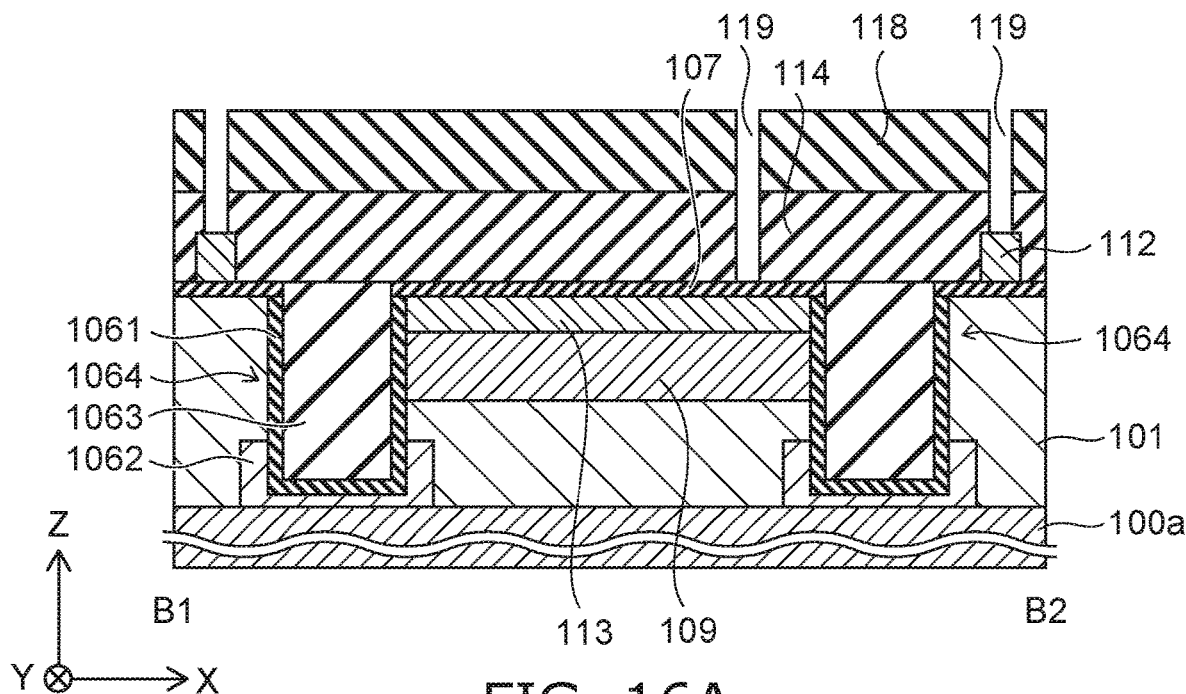
Figure 16B:
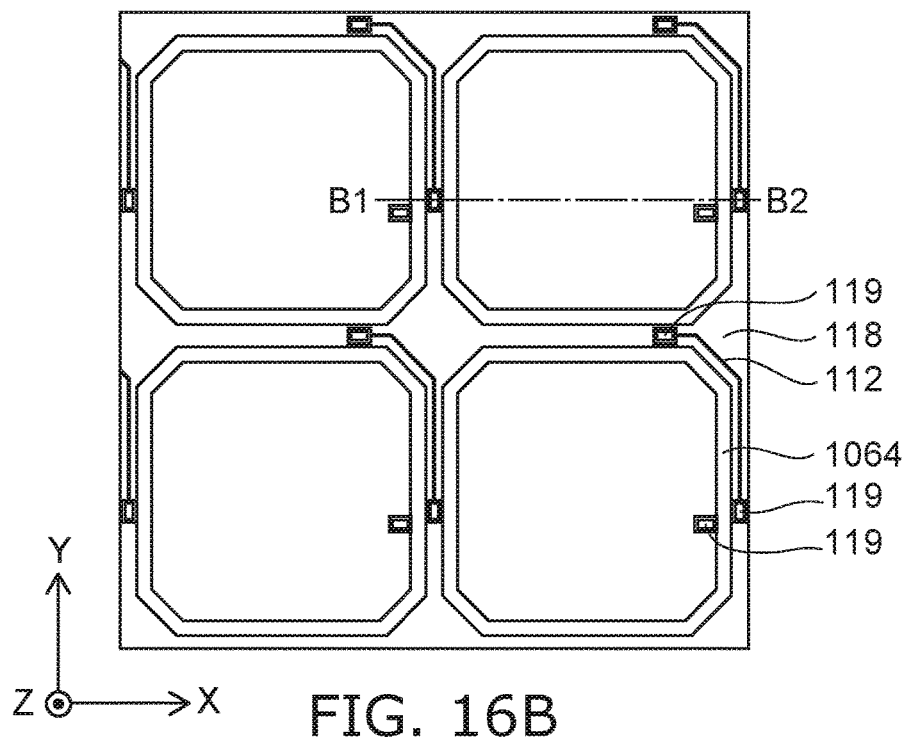

As shown in FIGS. 16A and 16B, 300 nm of an insulating film 118 is deposited by CVD. Contact holes 119 are formed on the quenching resistance 112 and the n-type avalanche layer 113 by a lithography process and an RIE process.

Figure 17A:
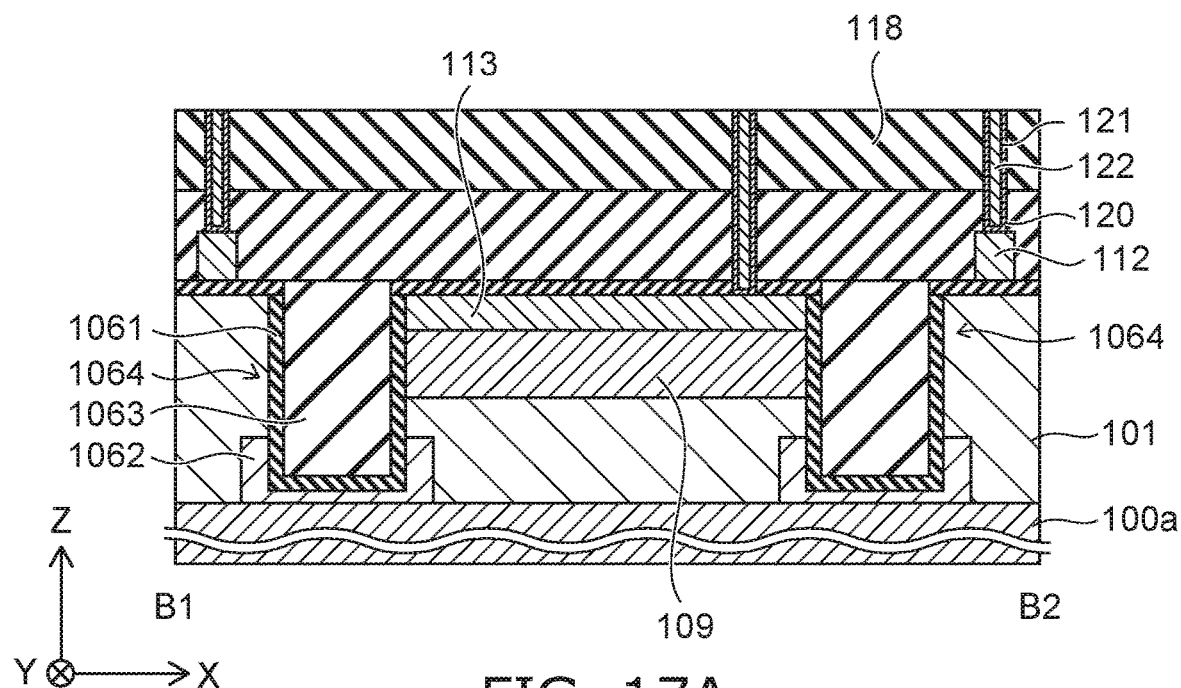
Figure 17B:
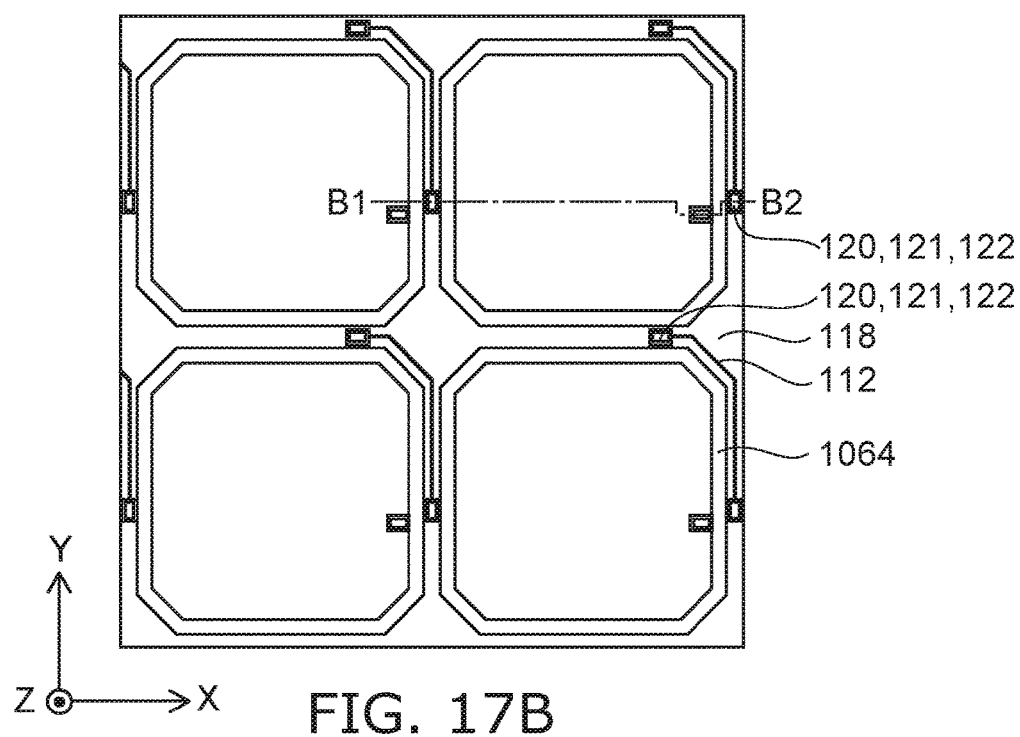
Figure 18A:
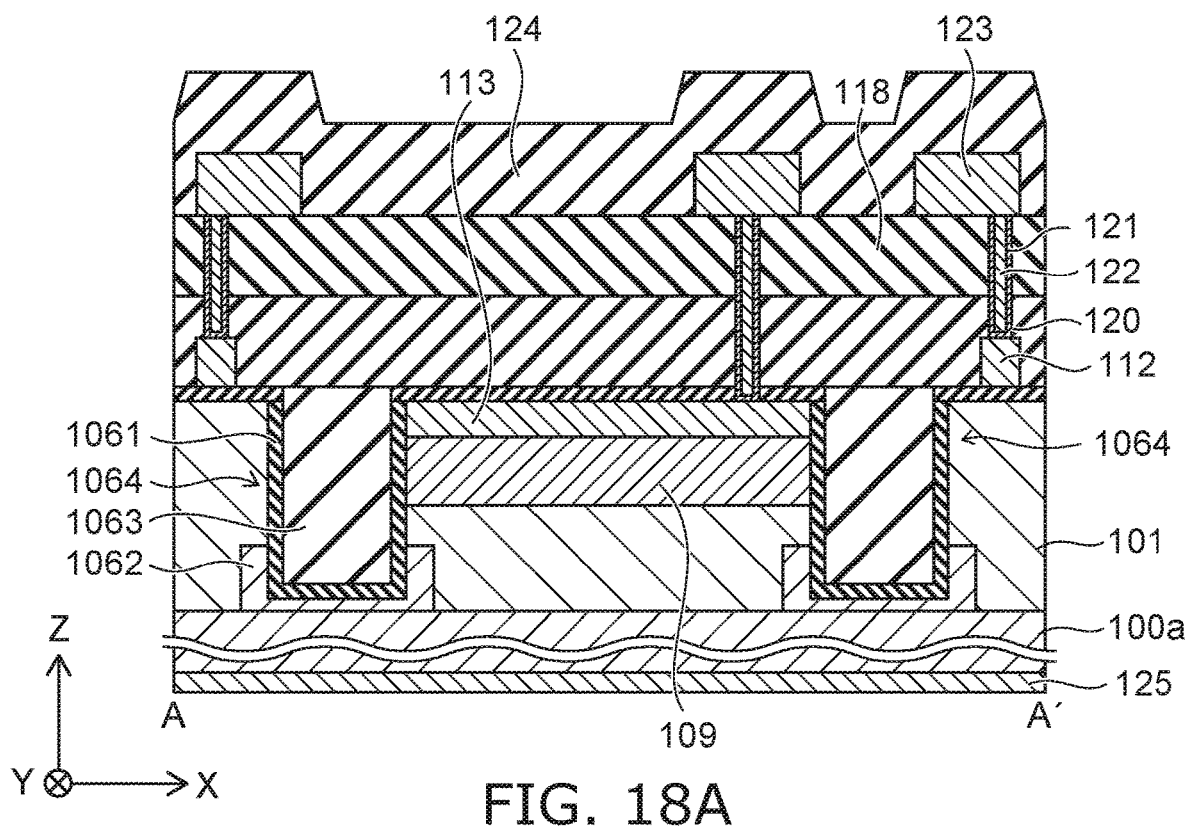
Figure 18B:
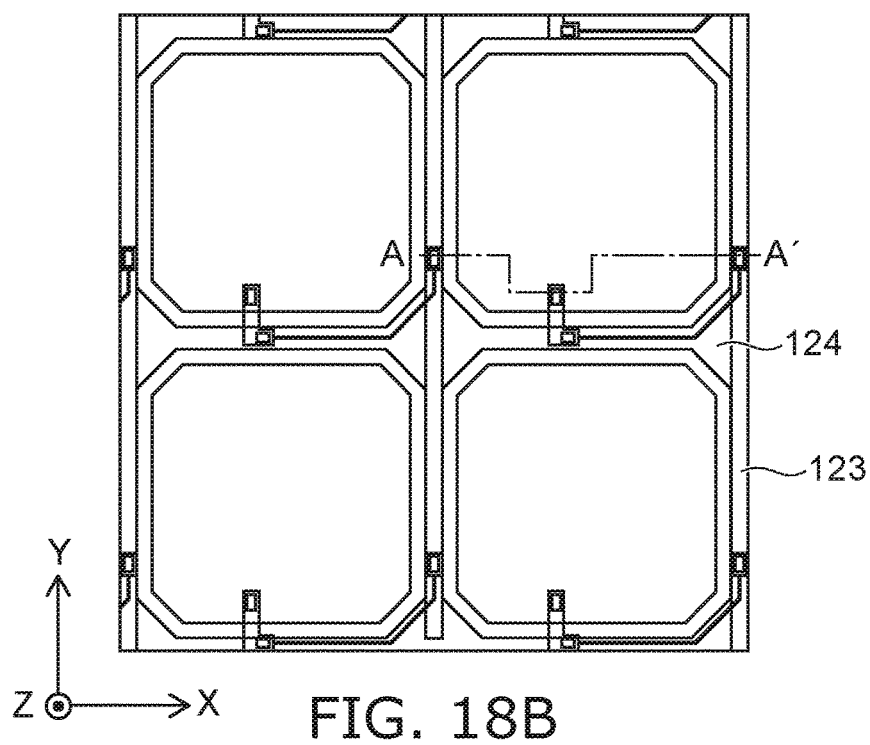
Figure 19:
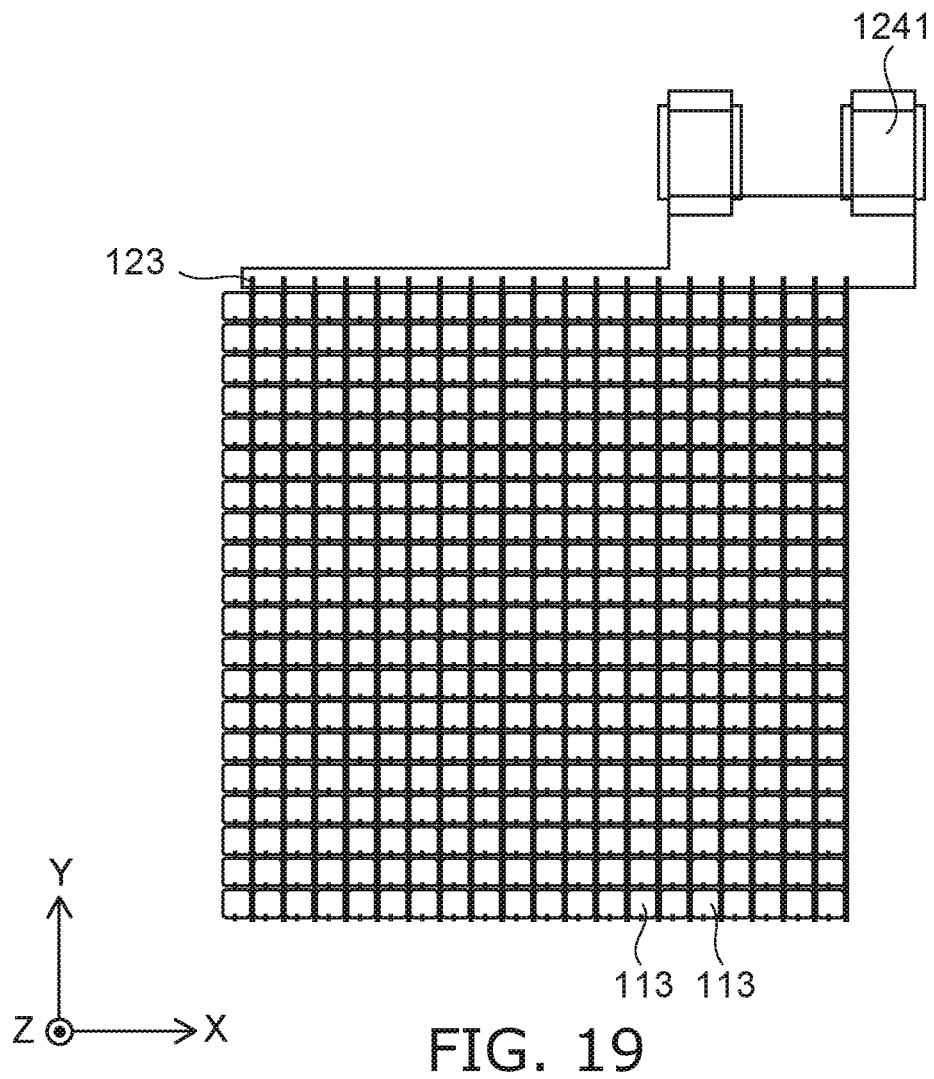

As shown in FIGS. 17A and 17B, 10 nm of a titanium film 120 and 10 nm of a titanium nitride film 121 are formed by sputtering. 300 nm of a tungsten film 122 is formed by CVD. The contact holes 119 are filled by planarizing the tungsten film 122, the titanium nitride film 121, and the titanium film 120 by CMP using the insulating film 118 as a stopper.

As shown in FIGS. 18A, 18B, and 19, 0.5 μm of an aluminum electrode 123 is formed by sputtering and patterned into a prescribed shape by a lithography process and an RIE process. 0.3 μm of a silicon nitride film is formed by CVD as a passivation film 124; and a read pad 1241 is exposed by RIE. Back grinding is performed until the thickness of the single-crystal p-type silicon substrate 100a is 600 μm. A Ti film and a Au film are formed as a back electrode 125. Thereby, the read pad 1241 side is the anode electrode of the avalanche photodiode, and the back electrode 125 side is the cathode electrode of the avalanche photodiode. The light detector 100 according to the embodiment is manufactured by the processes described above.

In the light detector 100, the conductive layer 5 corresponds to the silicon substrate 100a in the manufacturing processes described above. The third semiconductor layer 13 and the semiconductor region 25 correspond to a portion of the silicon epitaxial layer 101. The structure body 21 corresponds to the first separation structure 1064 that includes the silicon oxide film 1061 and the oxide film 1063. The semiconductor region 23 corresponds to the implantation region 1062. The insulating layer 41 corresponds to the silicon oxide film 107. The second semiconductor layer 12 corresponds to the p-type avalanche layer 109. The quenching resistance 30 corresponds to the quenching resistance 112. The first semiconductor layer 11 corresponds to the n-type avalanche layer 113. The insulating layer 42 corresponds to the insulating film 114. The insulating layer 43 corresponds to the insulating film 118. The contacts 31 and 32 correspond to the titanium film 120, the titanium nitride film 121, and the tungsten film 122. The connection interconnect 33 and the first interconnect 51 correspond to the aluminum electrode 123. The insulating layer 44 corresponds to the passivation film 124. The pad 55 corresponds to the pad 1241. The electrode 50 corresponds to the back electrode 125.

Effects of the first embodiment will now be described.

In the light detector 100, the structure body 21 is provided in each element 1. The refractive index of the structure body 21 is different from the refractive index of the photodiode PD. When light enters the photodiode PD and secondary photons are generated, the secondary photons that travel toward the adjacent photodiodes PD are reflected by the interface of the structure body 21. Crosstalk noise can be reduced by providing the structure body 21.

In the light detector 100, at least portions of the structure bodies 21 are separated from each other. Thereby, compared to when one separation structure is provided between mutually-adjacent elements 1, the number of interfaces of the structure body 21 between the mutually-adjacent photodiodes PD is increased. By increasing the number of interfaces, the secondary photons that travel toward the adjacent photodiodes PD when the secondary photons are generated in the photodiode PD are reflected more easily. The crosstalk noise can be further reduced thereby. To reduce the crosstalk noise further, it is favorable for the entire structure bodies 21 to be separated from each other.

As shown in FIGS. 3 and 4, the structure body 21 is a five-or-higher-sided polygon or a rounded polygon when viewed from the Z-direction. According to this structure, the stress at the vertices of the structure body 21 can be relaxed by increasing the angles of the vertices of the structure body 21. For example, by relaxing the stress, the occurrence of cracks in the semiconductor region 25 can be suppressed, and operation errors caused by the occurrence of cracks can be suppressed. Also, if cracks occur in the silicon epitaxial layer 101 when forming the structure body 21 (the first separation structure 1064), there is a possibility that a resist in a subsequent photolithography process may enter the cracks. If the resist enters the cracks, a residue of the resist may remain in the cracks when stripping the resist. The residue of the resist causes organic contamination of oxidation ovens in subsequent heating processes such as oxidization. These problems can be solved by relaxing the stress at the vertices of the structure body 21.

For example, as shown in FIGS. 3 and 4, the structure body 21 includes the first extension portion 21-1, the second extension portion 21-2, and the link portions 21C. It is favorable for the angle between the first extension portion 21-1 and the link portion 21C and the angle between the second extension portion 21-2 and the link portion 21C to be 135 degrees or more. The exterior angle between the first extension portion 21-1 and the link portion 21C and the exterior angle between the second extension portion 21-2 and the link portion 21C can be increased thereby. The stress at the vertices of the structure body 21 can be relaxed by increasing these exterior angles. As shown in FIG. 4, at least a portion of the link portions 21C of the structure body 21 may be curved. The concentration of the stress in the structure body 21 can be relaxed further by curving the link portion 21C.

It is favorable for the lengths in the X-direction and the Y-direction of the link portion 21C to be 1 μm or more. The stress that is generated at the link portion 21C can be relaxed further thereby.

The inventors applied a negative operating voltage (Vop) to the electrode 50 of the light detector 100 according to the first embodiment and read a pulse signal from the pad 55. The operating voltage was set in the range of −25 V to −35 V. In the light detector 100, the structure body 21 that surrounds the photodiode PD is provided in each element 1. In other words, two structure bodies 21 exist between the mutually-adjacent photodiodes PD. The secondary photons are easily refracted more by the two structure bodies 21. For example, a light detector of a reference example includes a separation structure having a lattice configuration extending in the X-direction and the Y-direction between the multiple photodiodes PD arranged in the X-direction and the Y-direction. Compared to the reference example, it was confirmed that the crosstalk noise was decreased. For example, the light detector 100 according to the first embodiment was made using the following conditions. The shape of the structure body 21 was an octagon when viewed from the Z-direction. The spacing between the photodiode PD centers was 25 μm. The length in the diametrical direction of the structure body 21 was 1.6 μm. The ratio of the sum of the surface areas in the X-Y plane of the multiple photodiodes PD to the surface area in the X-Y plane of the conductive layer 5 was 0.6. The design was performed so that a depletion layer of 3 μm extended from the p-n junction surface of the photodiode PD toward the conductive layer 5. When comparing the crosstalk noise of the light detector 100 and the crosstalk noise of the light detector according to the reference example, the crosstalk noise of the light detector 100 was 30% less than the crosstalk noise of the light detector according to the reference example.

Modification

Figure 20:
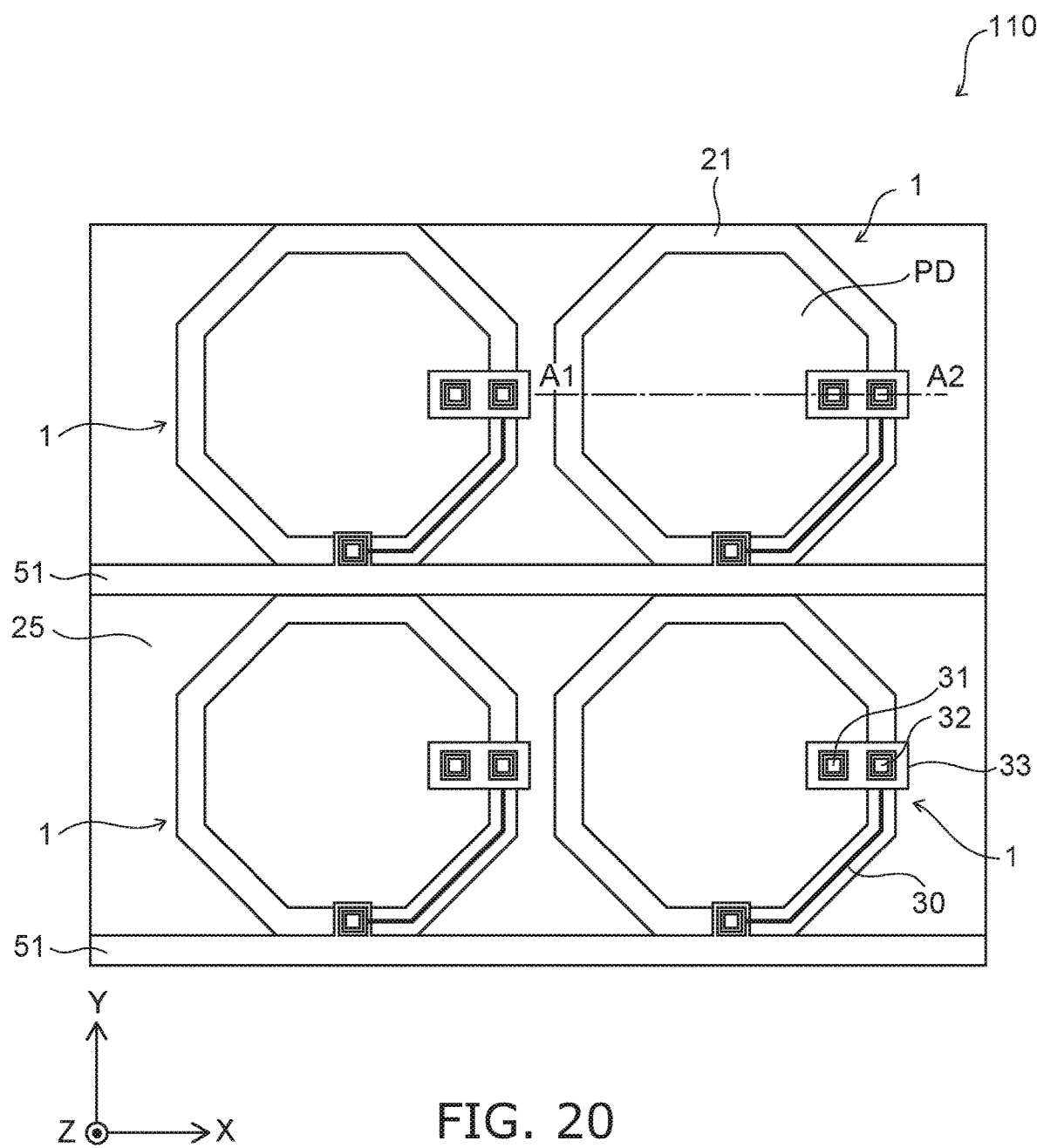
FIG. 20 is a schematic plan view illustrating a light detector according to a modification of the first embodiment.

FIG. 20 is a schematic plan view illustrating a light detector according to a modification of the first embodiment.

Figure 21:
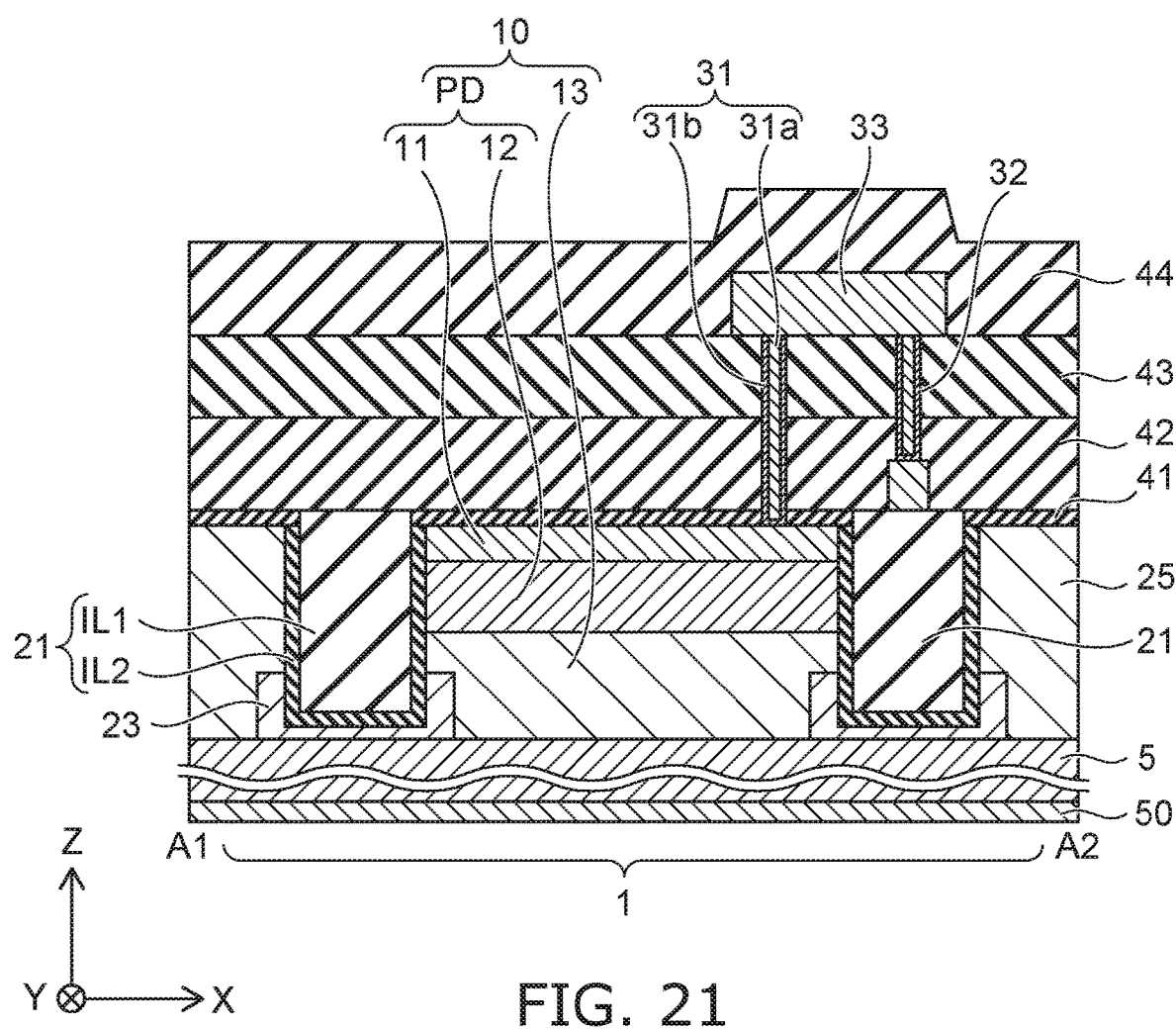
FIG. 21 is an A1-A2 cross-sectional view of FIG. 20.

FIG. 21 is an A1-A2 cross-sectional view of FIG. 20.

The insulating layers 41 to 44 are not illustrated in FIG. 20 to show the element 1, the quenching resistance 30, the first interconnect 51, etc.

In the modification, the quenching resistance 30 is arranged in the Z-direction with the structure body 21. Compared to when the quenching resistance 30 is arranged in the Z-direction with the semiconductor region 25 as shown in FIG. 2, the distance between the semiconductor region 25 and the quenching resistance 30 is longer when the quenching resistance 30 is arranged in the Z-direction with the structure body 21. The structure body 21 that is thicker than the insulating layer 41 exists between the semiconductor region 25 and the quenching resistance 30. Therefore, the likelihood of dielectric breakdown occurring when the voltage of the quenching resistance 30 increases can be reduced. For example, the design degrees of freedom of the breakdown voltage of the photodiode PD is increased.

Second Embodiment

Figure 22:
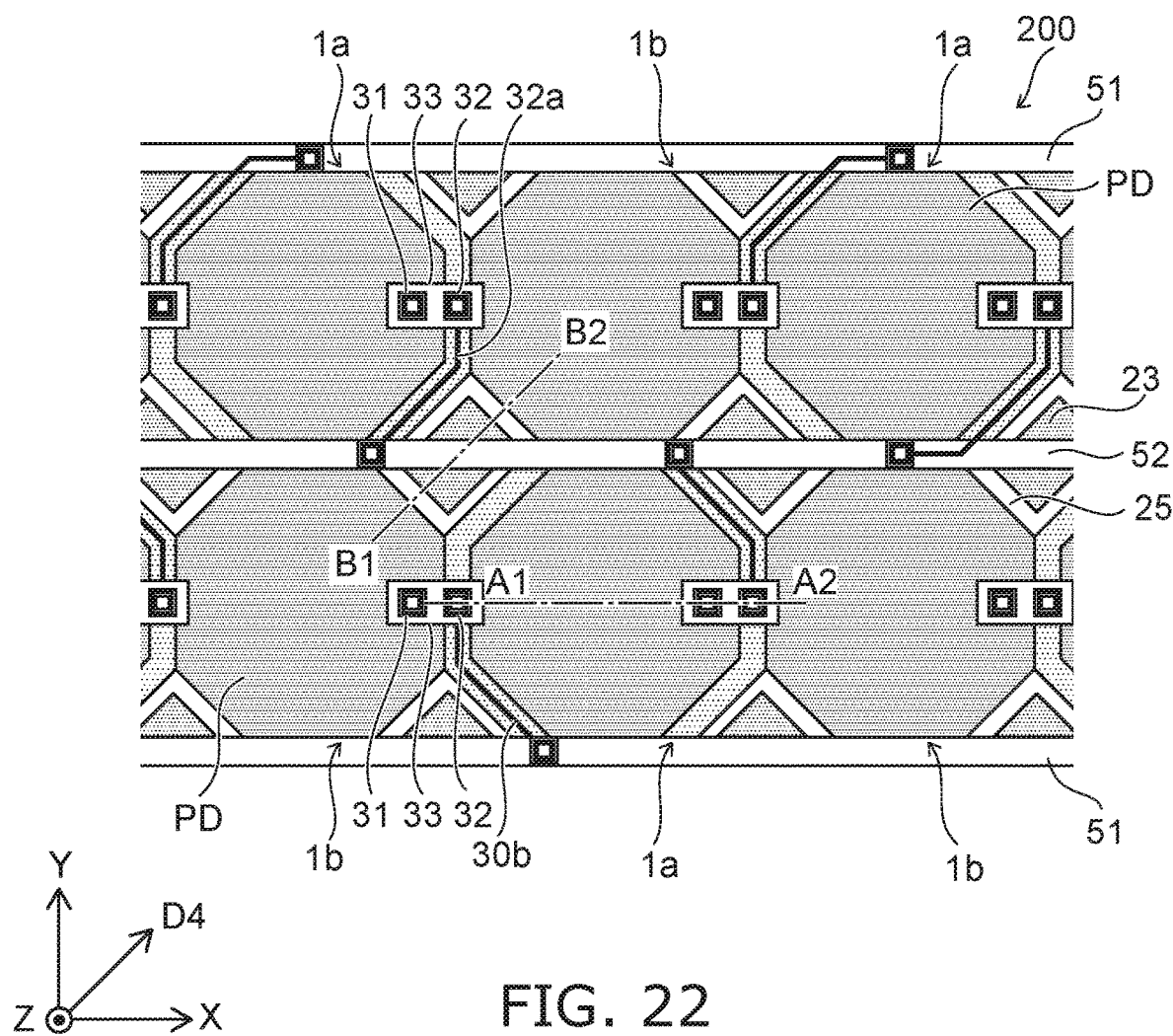
FIG. 22 is a schematic plan view illustrating a portion of the light detector according to the second embodiment.

FIG. 22 is a schematic plan view illustrating a portion of the light detector according to the second embodiment.

Figure 23:
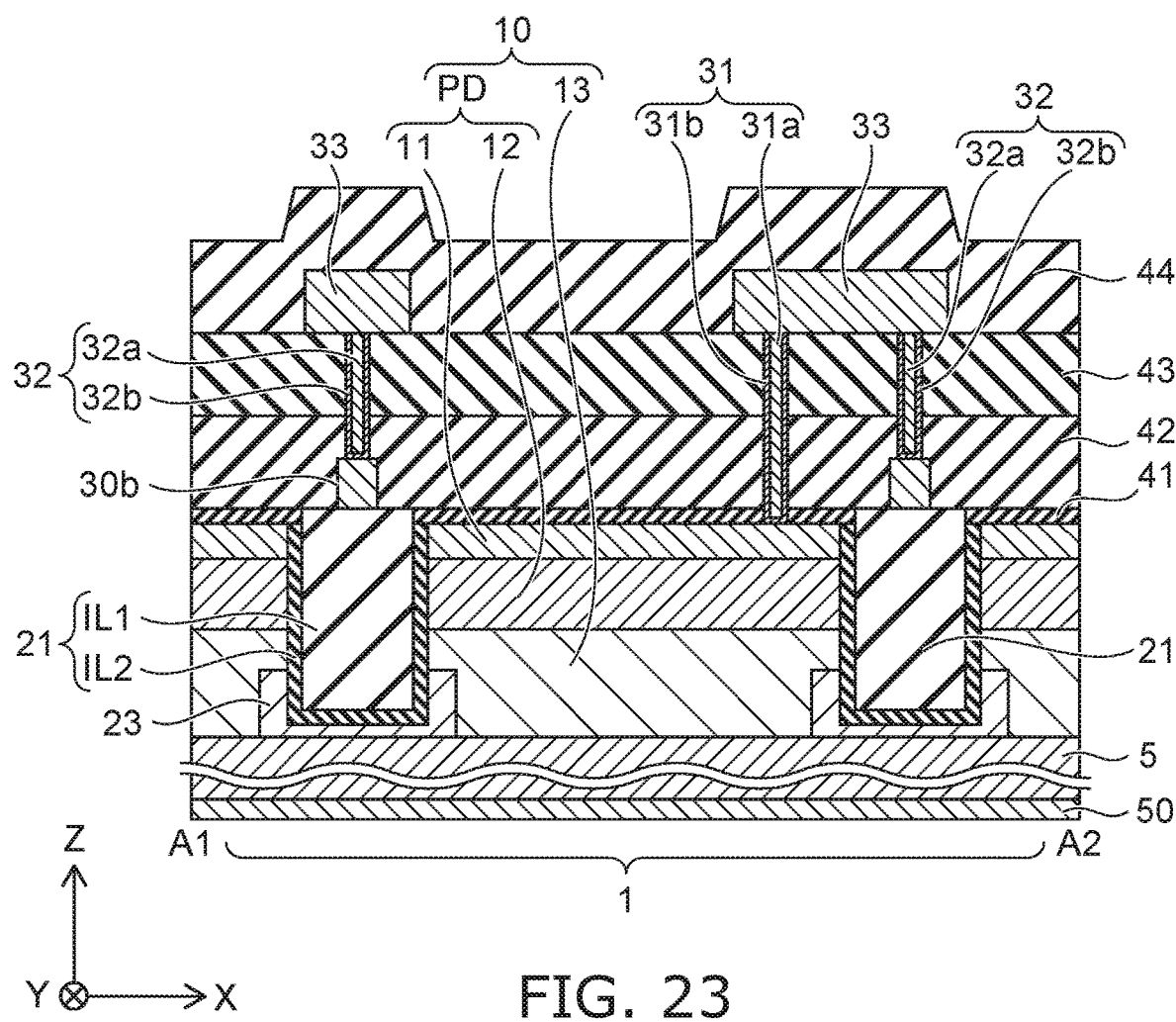
FIG. 23 is an A1-A2 cross-sectional view of FIG. 22.

FIG. 23 is an A1-A2 cross-sectional view of FIG. 22.

Figure 24:
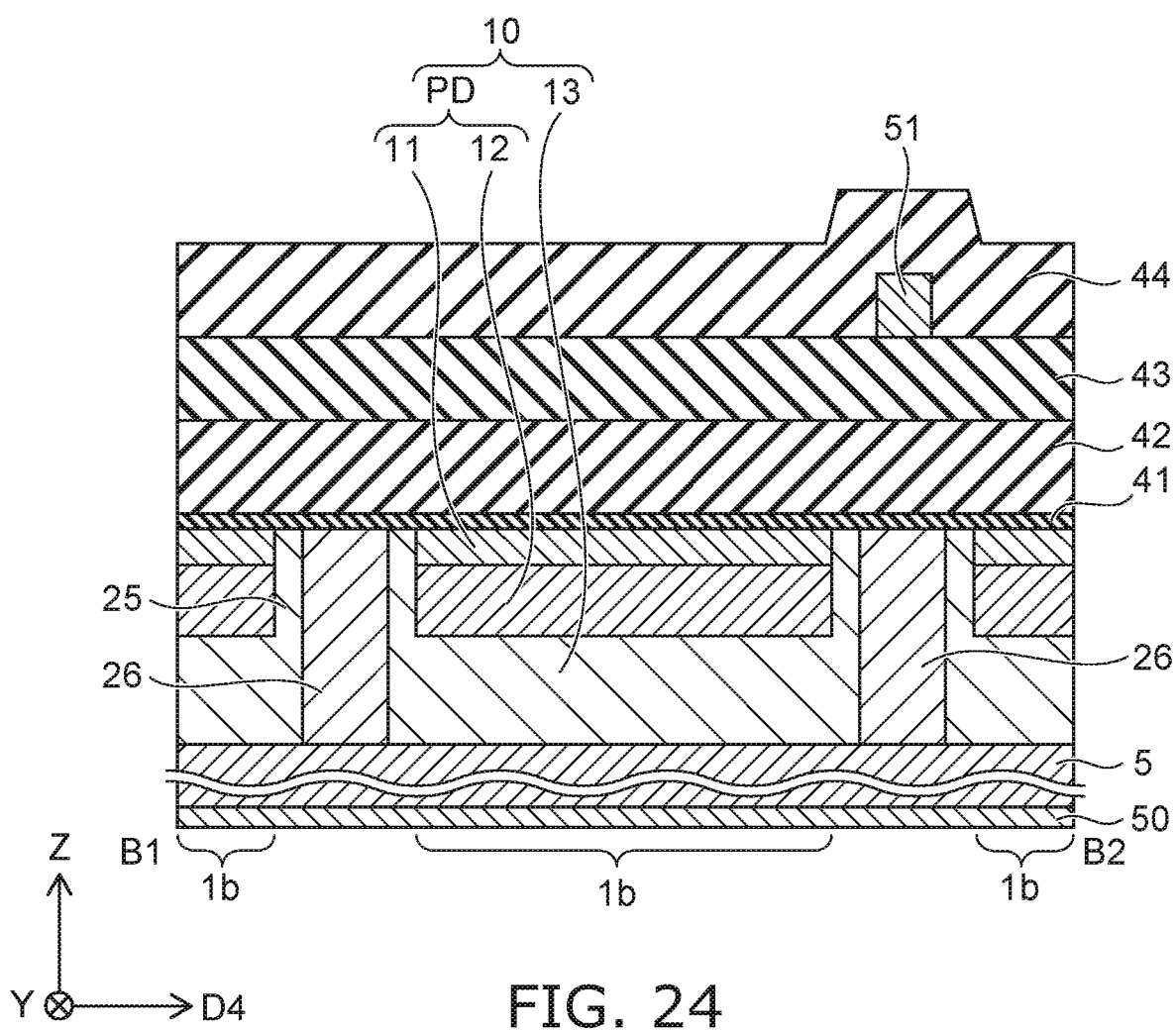
FIG. 24 is a B1-B2 cross-sectional view of FIG. 22.

FIG. 24 is a B1-B2 cross-sectional view of FIG. 22.

The insulating layers 41 to 44 are not illustrated in FIG. 22 to show the element 1, the quenching resistance 30, the first interconnect 51, a second interconnect 52, etc.

In the light detector 200 according to the second embodiment as shown in FIGS. 22 and 23, the multiple elements 1 include multiple first elements 1a and multiple second elements 1b. The multiple first elements 1a and the multiple second elements 1b are alternately arranged in the X-direction and the Y-direction. In other words, the multiple first elements 1a and the multiple second elements 1b are provided in a staggered lattice configuration.

The first element 1a includes the structure body 21 surrounding the photodiode PD. The second element 1b does not include the structure body 21. Therefore, one structure body 21 is provided between the photodiodes PD adjacent to each other in the X-direction or the Y-direction. One structure body 21 is provided between the photodiodes PD of the first element 1a in a fourth direction D4 that crosses the X-direction and the Y-direction and is perpendicular to the Z-direction. The structure body 21 is not provided between the photodiodes PD of the second element 1b in the fourth direction D4.

For example, as shown in FIG. 24, the semiconductor region 25 is provided between the second elements 1b in the fourth direction D4. The semiconductor region 25 contacts the photodiode PD of the second element 1b. A p-type semiconductor region 26 may be provided between the photodiodes PD of the second elements 1b in the fourth direction D4. The p-type impurity concentration in the semiconductor region 26 is greater than the p-type impurity concentrations in the third semiconductor layer 13 and the semiconductor region 25. The movement of the electrons between the second elements 1b can be suppressed by the semiconductor region 26, and the crosstalk noise can be reduced.

For example, the semiconductor region 26 is formed by ion-implanting boron between the second elements 1b. The semiconductor region 26 can be formed by defining the region in which the semiconductor region 26 is to be formed by photolithography and subsequently implanting boron with the condition of $3.0 \times 10^{12}$ cm$^{-2}$ with an implantation acceleration voltage of 70 keV.

Quenching parts are electrically connected respectively to the photodiode PD of the first element 1a and the photodiode PD of the second element 1b. For example, the multiple quenching parts include multiple first quenching parts and multiple second quenching parts. Here, an example is described in which each quenching part is a resistor. The multiple quenching resistances 30 include multiple first quenching resistances 30a and multiple second quenching resistances 30b. The first quenching resistance 30a is electrically connected to the photodiode PD of the first element 1a. The second quenching resistance 30b is electrically connected to the photodiode PD of the second element 1b. For example, the photodiode PD (the first photodiode) of the first element 1a is surrounded with the structure body 21 (the first structure body). The first quenching resistance 30a is electrically connected to the first photodiode. The second quenching resistance 30b is electrically connected to the photodiode PD (the second photodiode) of the second element 1b.

The first quenching resistance 30a and the second quenching resistance 30b are arranged in the Z-direction with the structure body 21. Specifically, the first quenching resistance 30a is arranged in the Z-direction with the structure body 21 of the first element 1a electrically connected to the first quenching resistance 30a. The second quenching resistance 30b is arranged in the Z-direction with the structure body 21 of the first element 1a adjacent to the second element 1b electrically connected to the second quenching resistance 30b.

The multiple first quenching resistances 30a that are arranged in the X-direction are electrically connected to one first interconnect 51. The multiple second quenching resistances 30b that are arranged in the X-direction are electrically connected to one second interconnect 52. For example, the multiple first interconnects 51 and the multiple second interconnects 52 are alternately provided in the Y-direction.

For example, the multiple first interconnects 51 and the multiple second interconnects 52 are electrically connected to mutually-different pads. Thereby, it is possible to separately read the signal detected by the first element 1a and the signal detected by the second element 1b.

Compared to the first embodiment, the number of the structure bodies 21 per unit area is less than in the light detector 200 according to the second embodiment. Therefore, according to the second embodiment, compared to the first embodiment, the surface area of the photodiodes PD can be increased, and the photon detection efficiency can be increased.

Mutually-different operating voltages may be applied to the first and second interconnects 51 and 52. Thereby, the operating condition of the photodiode PD of the first element 1a and the operating condition of the photodiode PD of the second element 1b can be different. For example, by using different operating conditions of the photodiodes PD, the photon detection efficiency of the first element 1a and the photon detection efficiency of the second element 1b can be different. For example, the signal that flows through the first interconnect 51 and the signal that flows through the second interconnect 52 can be separately used according to processing corresponding to the necessary detection efficiency.

For example, the light detectors according to the embodiments are used to detect reflected light after light is emitted from a light source. The time from emitting the light until the reflected light is detected is used in light time-of-flight ranging (ToF) to calculate the distance between the light source and the object that reflected the light. For example, when imaging the distance of a proximate position with a relatively high number of photons of the reflected light, the signals of the first and second interconnects 51 and 52 are read collectively, and the dynamic range is ensured. When imaging the distance of a distant position with a relatively low number of photons, the precision of the distance is ensured by separately reading the signals of the first and second interconnects 51 and 52. For example, the signal of the second interconnect 52 is input to a time-to-digital converter (TDC), and the distance measurement is performed by ToF using the output pulse height. The signal of the first interconnect 51 is processed by an analog-to-digital converter (ADC), and the distance precision is increased by performing a more accurate measurement of the number of photons.

First Modification

Figure 25:
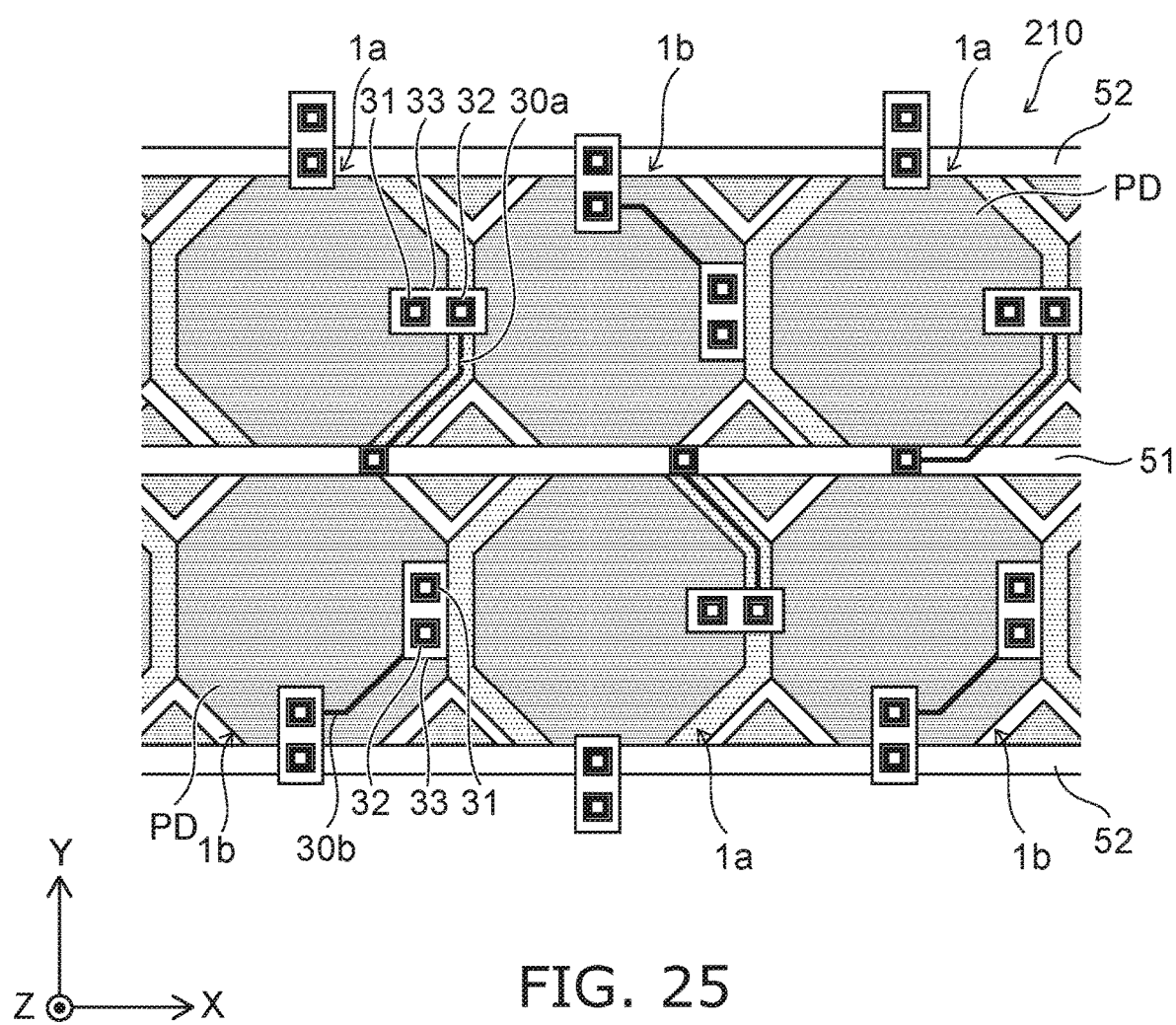
FIG. 25 is a schematic plan view illustrating a portion of a light detector according to a first modification of the second embodiment.

FIG. 25 is a schematic plan view illustrating a portion of a light detector according to a first modification of the second embodiment.

The insulating layers 41 to 44 are not illustrated in FIG. 25 to show the element 1, the quenching resistance 30, the first interconnect 51, the second interconnect 52, etc.

In the light detector 210 shown in FIG. 25, the first quenching resistance 30a is arranged with the structure body 21 in the Z-direction. The second quenching resistance 30b is not arranged with the structure body 21 in the Z-direction. In other words, the second quenching resistance 30b is provided at a different position from the structure body 21 when viewed from the Z-direction. The second quenching resistance 30b is arranged with the photodiode PD in the Z-direction.

An electrical second capacitance between the second quenching resistance 30b and the photodiode PD electrically connected to the second quenching resistance 30b is greater than an electrical first capacitance between the first quenching resistance 30a and the photodiode PD electrically connected to the first quenching resistance 30a. Due to the capacitance difference, the time constant of the signal detected by the second element 1b is less than the time constant of the signal detected by the first element 1a.

Figure 26:
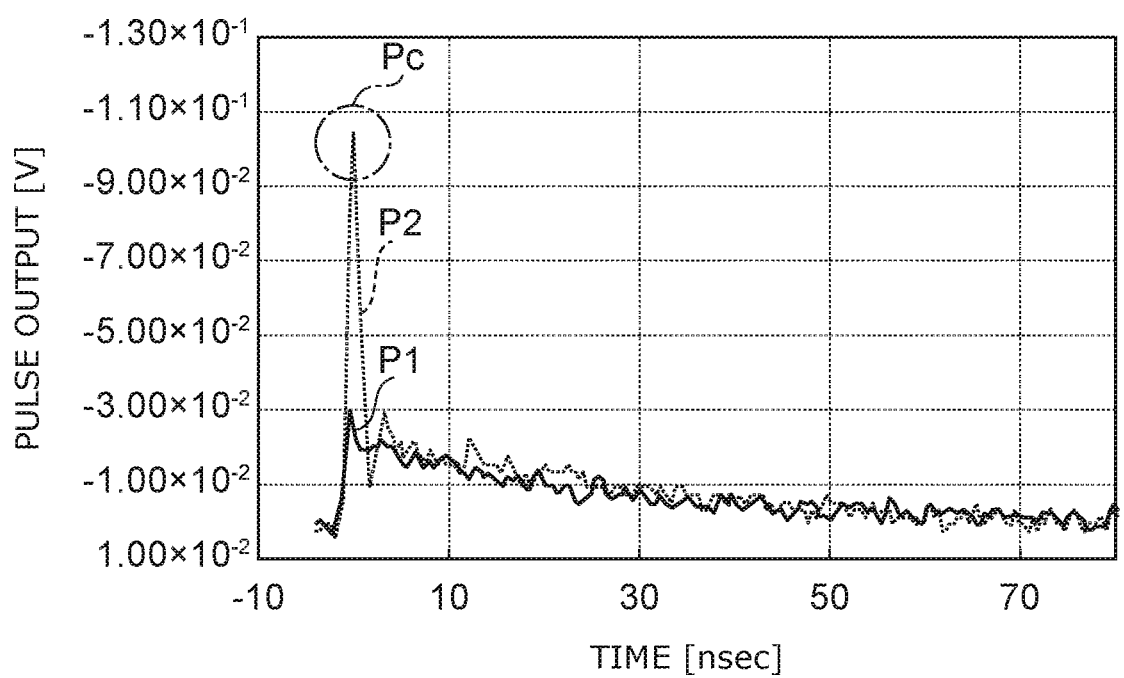
FIG. 26 is a graph illustrating characteristics of the light detector according to the first modification of the second embodiment.

FIG. 26 is a graph illustrating characteristics of the light detector according to the first modification of the second embodiment.

In FIG. 26, the horizontal axis is the time elapsed from the detection of the photon. The vertical axis is the output when detecting the photon. A pulse P1 shown by the solid line is the output pulse from the first element 1a. A pulse P2 shown by the broken line is the output pulse from the second element 1b.

As shown in FIG. 26, a high-speed pulse component Pc that has a short time constant strongly appears in the pulse P2 due to the capacitance component between the first semiconductor layer 11 and the quenching resistance 30b. As a result, for example, for the second element 1b measuring the distance by using TDC, the set margin of the threshold voltage is wider, and the time resolution is increased. The pulse component Pc that is generated by the parasitic capacitance is a pseudo-crosstalk component. The crosstalk component causes an erroneous detection of the distance when measuring the distance by using ADC. Therefore, it is desirable to use the pulse P1 output from the first element 1a when measuring the distance by using ADC.

Second Modification

Figure 27:
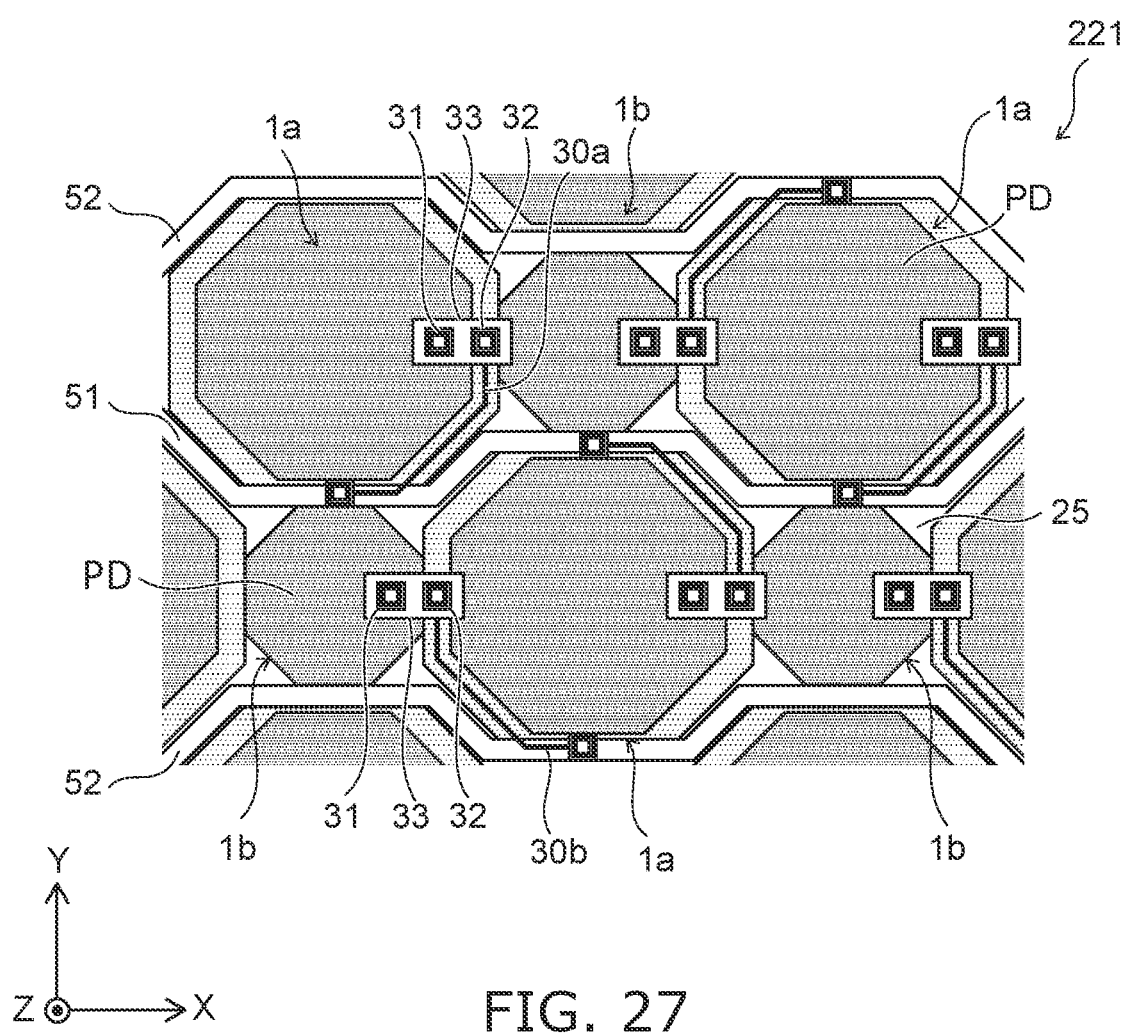
FIGS. 27 to 29 are schematic plan views illustrating a portion of a light detector according to a second modification of the second embodiment.
Figure 28:
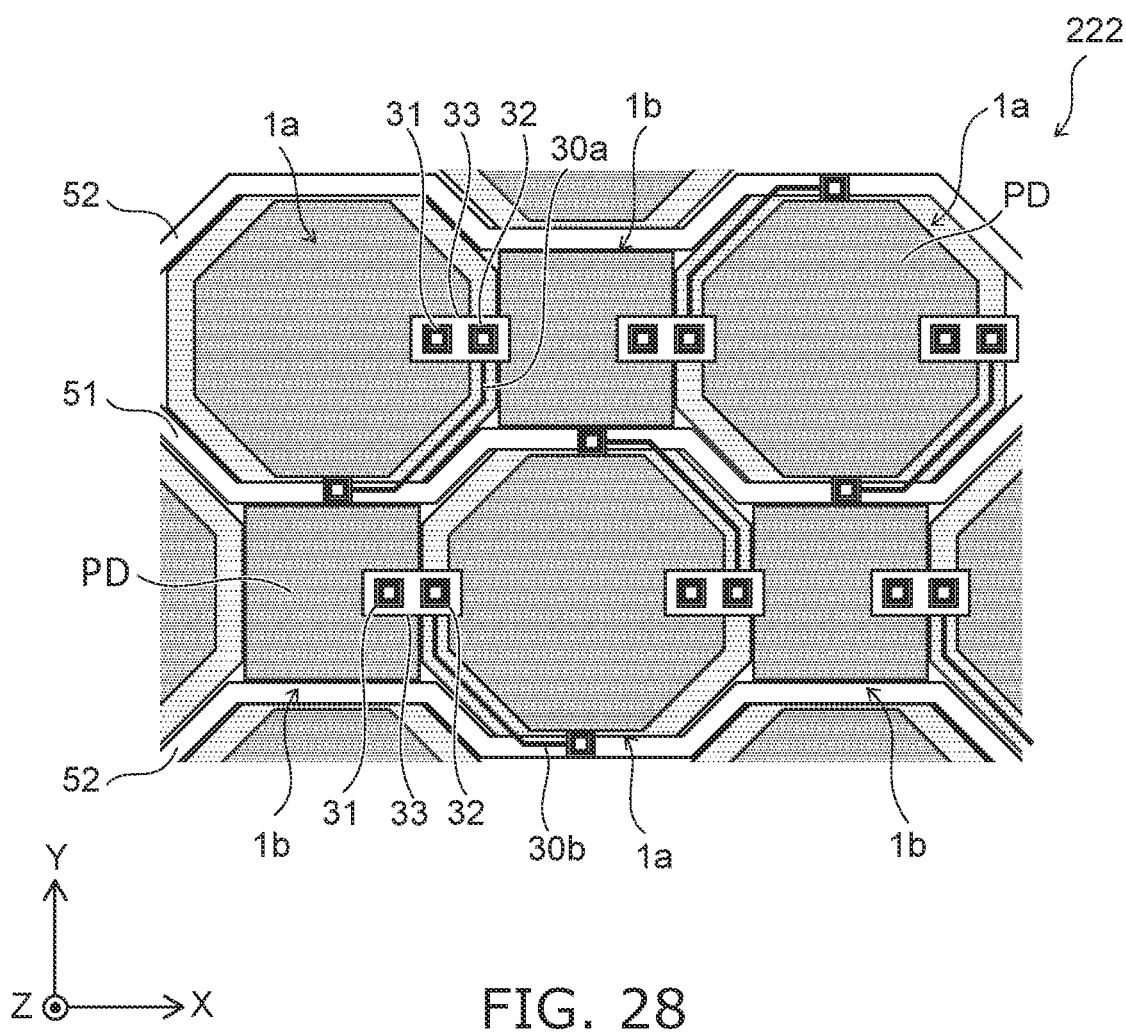
Figure 29:
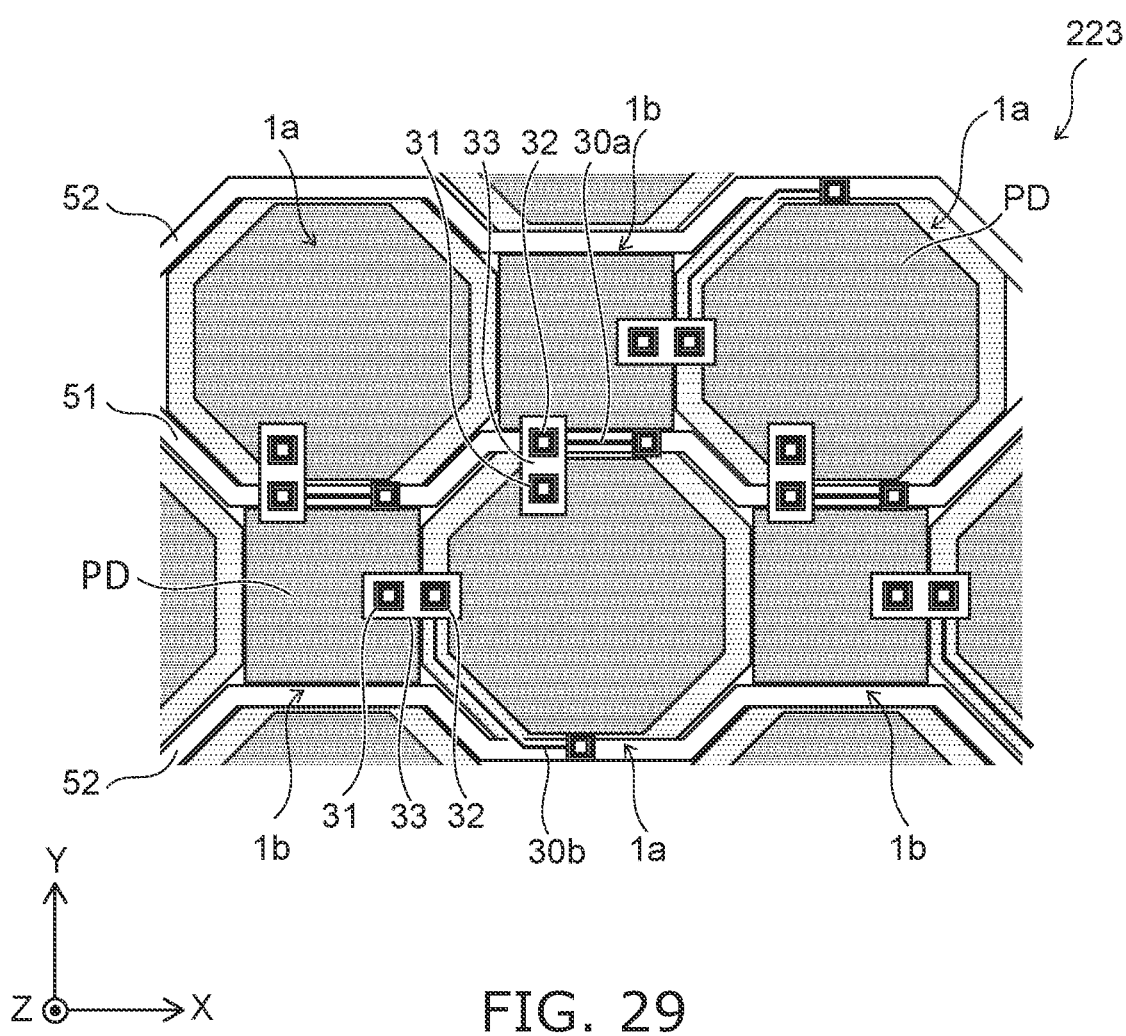

FIGS. 27 to 29 are schematic plan views illustrating portions of light detectors according to a second modification of the second embodiment.

In FIGS. 27 to 29, the arrangements of the quenching resistances and the contacts are illustrated as being frontward of the first and second interconnects 51 and 52 in the page surface. Also, the insulating layers 41 to 44 are not illustrated to show the element 1, the quenching resistance 30, the first interconnect 51, the second interconnect 52, etc.

In a light detector 221 shown in FIG. 27, compared to the light detector 200, the surface area in the X-Y plane of the photodiode PD of the second element 1b is less than the surface area in the X-Y plane of the photodiode PD of the first element 1a.

According to the second modification, the capacitance of the p-n junction in the second element 1b can be reduced. The crosstalk noise can be reduced thereby. Also, by reducing the time constant of the output pulse output from the second element 1b, the output pulse can be read faster, and the dynamic range can be improved. As a result, for example, the distance between the light detector 221 and a subject having a high reflectance can be calculated with higher precision when the subject exists at a position that is relatively proximate to the light detector.

In the light detector 221, the shape of the photodiode PD of the second element 1b is an octagon when viewed from the Z-direction. The shape of the photodiode PD of the second element 1b may be a shape other than an octagon. For example, in a light detector 222 shown in FIG. 28, the shape of the photodiode PD of the second element 1b is a rectangle when viewed from the Z-direction. According to the light detector 222, compared to the light detector 221, the surface area in the X-Y plane of the photodiode PD of the second element 1b can be increased. The photon detection efficiency of the second element 1b can be increased thereby.

The electrical resistance of the quenching resistance 30a and the electrical resistance of the quenching resistance 30b may be different from each other. In a light detector 223 shown in FIG. 29, the electrical resistance of the quenching resistance 30a is less than the electrical resistance of the quenching resistance 30b. For example, the length of the quenching resistance 30a is less than the length of the quenching resistance 30a when viewed from the Z-direction. Thereby, the time constant of the output pulse output from the first element 1a can be reduced, and the dynamic range can be improved. By reducing the p-n junction area, the time constant of the output pulse from the second element 1b can be reduced. By reducing the quenching resistance value, the time constant of the output pulse from the first element 1a can be reduced. By reducing the time constant of the output pulse from both the first element 1a and the second element 1b, the entire dynamic range of the multiple elements 1 can be increased.

Third Embodiment

Figure 30:
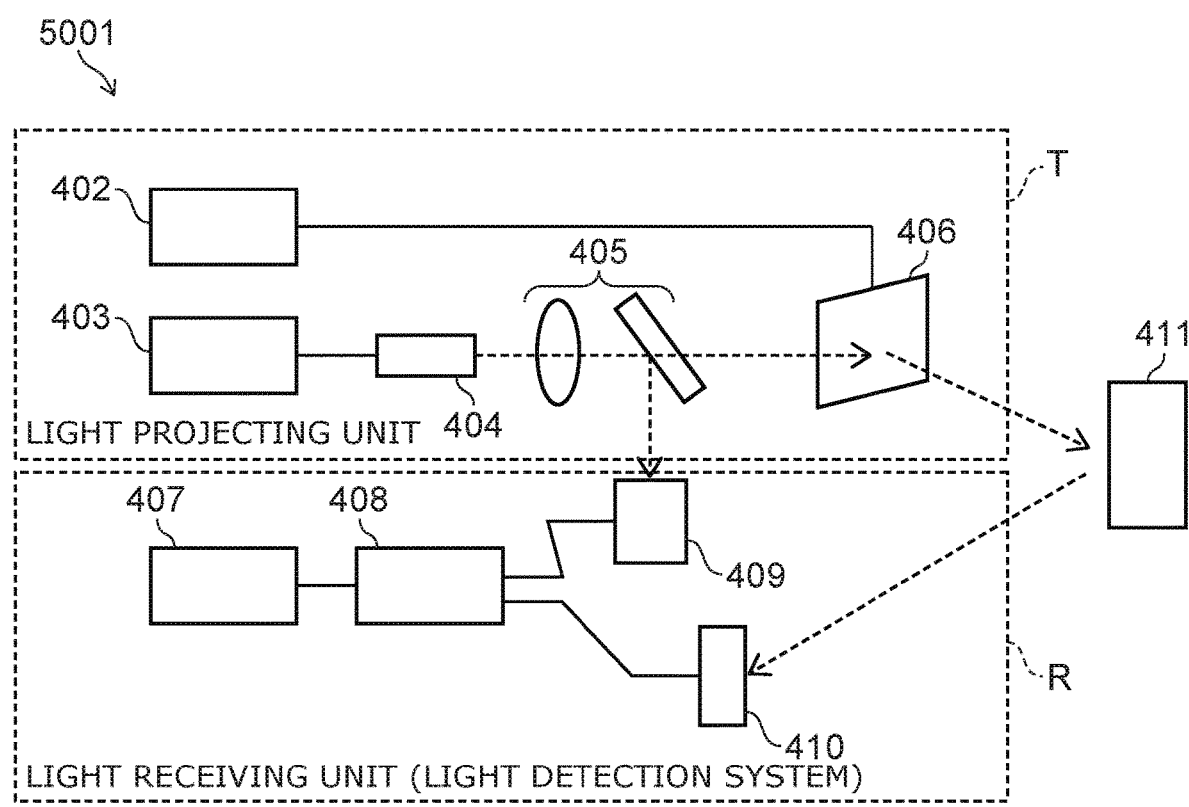
FIG. 30 is a schematic view illustrating a lidar device according to a third embodiment.

FIG. 30 is a schematic view illustrating a lidar (Laser Imaging Detection and Ranging (LIDAR)) device according to a third embodiment.

The embodiment is applicable to a long-distance subject detection system (LIDAR) or the like including a line light source and a lens. The lidar device 5001 includes a light projecting unit T projecting laser light toward an object 411, and a light receiving unit R (also called a light detection system) receiving the laser light from the object 411, measuring the time of the round trip of the laser light to and from the object 411, and converting the time into a distance.

In the light projecting unit T, a laser light oscillator (also called a light source) 404 produces laser light. A drive circuit 403 drives the laser light oscillator 404. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light receiving unit R, a reference light detector 409 detects the reference light extracted by the optical system 405. A light detector 410 receives the reflected light from the object 411. A distance measuring circuit 408 measures the distance to the object 411 based on the reference light detected by the reference light detector 409 and the reflected light detected by the light detector 410. An image recognition system 407 recognizes the object 411 based on the results measured by the distance measuring circuit 408.

The lidar device 5001 employs ToF in which the time of the round trip of the laser light to and from the object 411 is measured and converted into a distance. The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band invisible to humans. For example, the lidar device 5001 can be used for obstacle detection in a vehicle.

Figure 31:
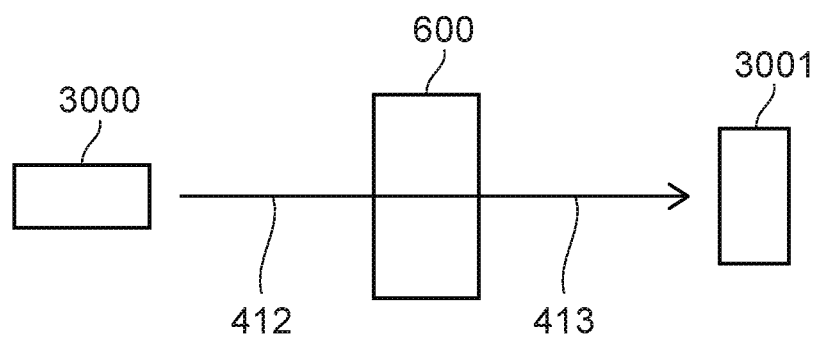
FIG. 31 is a drawing for describing the detection of the detection object of the lidar device.

FIG. 31 is a drawing for describing the detection of the detection object of the lidar device.

A light source 3000 emits light 412 toward an object 600 which is the detection object. A light detector 3001 detects light 413 that passes through the object 600, is reflected by the object 600, or is diffused by the object 600.

For example, the light detector 3001 realizes a highly-sensitive detection when the light detector according to the embodiment described above is used. It is favorable to provide multiple sets of the light detector 410 and the light source 404 and to preset the arrangement relationship in the software (which is replaceable with a circuit). For example, it is favorable for the arrangement relationship of the sets of the light detector 410 and the light source 404 to be provided at uniform spacing. Thereby, an accurate three-dimensional image can be generated by the output signals of each light detector 410 complementing each other.

Figure 32:
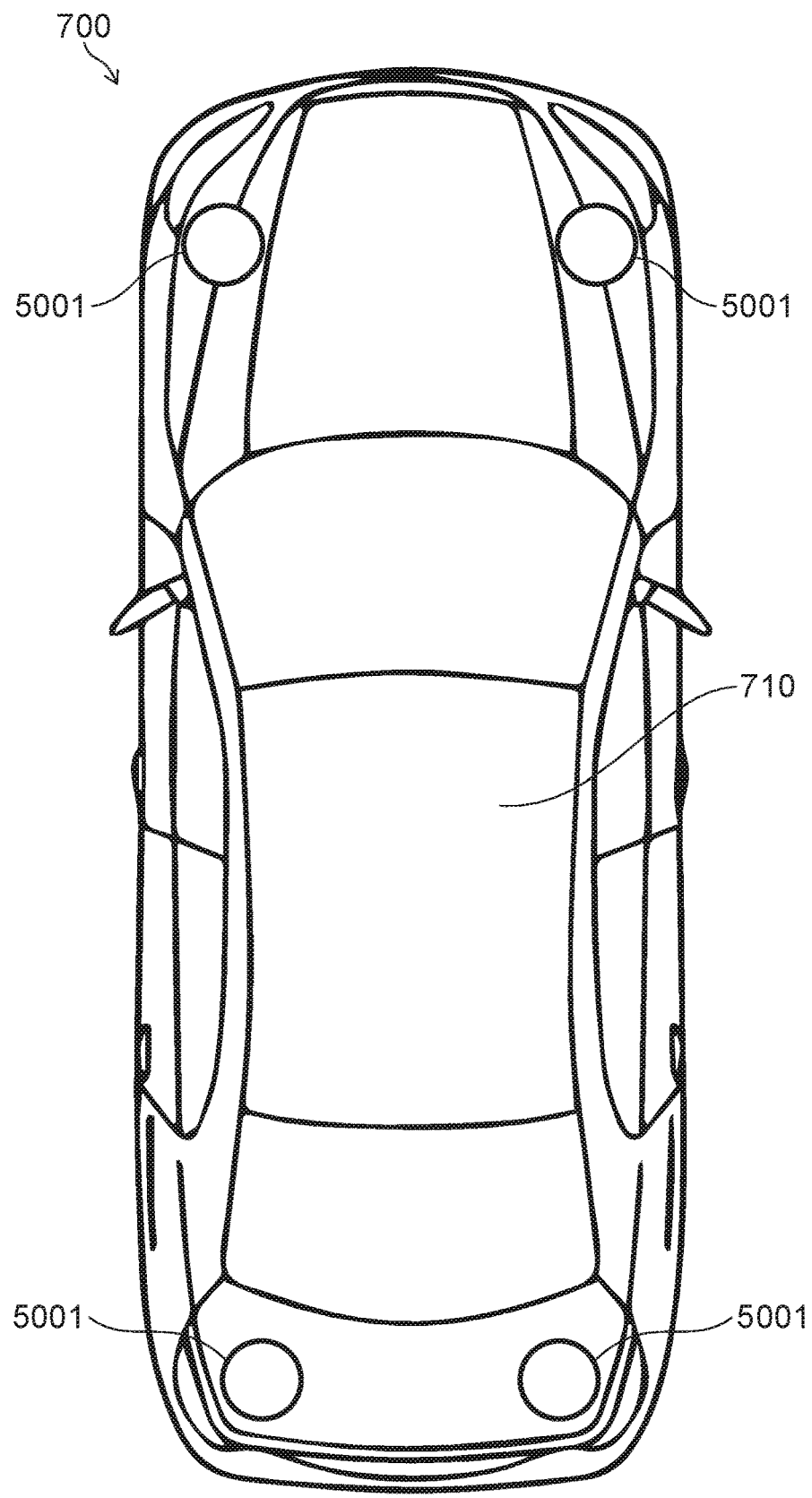
FIG. 32 is a schematic top view of a vehicle including the lidar device according to the third embodiment.

FIG. 32 is a schematic top view of a vehicle including the lidar device according to the third embodiment.

The vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar devices.

The embodiments may include the following clauses.

Clause 1

A light detector, comprising:
an element including a photodiode and a structure body surrounding the photodiode, the structure body having a different refractive index from the photodiode,
a plurality of the elements being provided,
at least portions of the plurality of structure bodies being separated from each other.

Clause 2

The light detector according to clause 1, further comprising:
a semiconductor region provided between mutually-adjacent elements of the plurality of elements.

Clause 3

The light detector according to clause 1 or 2, wherein
the plurality of elements is arranged along a first direction and a second direction, the second direction crossing the first direction,
one of a plurality of the structure bodies includes:
a pair of first extension portions extending in the first direction;
a pair of second extension portions extending in the second direction; and
a plurality of link portions linking the pair of first extension portions and the pair of second extension portions,
one of a plurality of the photodiodes is provided between the pair of second extension portions in the first direction and provided between the pair of first extension portions in the second direction, and
an angle between the first extension portion and the link portion and an angle between the second extension portion and the link portion are 135 degrees or more.

Clause 4

The light detector according to clause 3, wherein
a length in the first direction and a length in the second direction of each of the link portions are 1 µm.

Clause 5

The light detector according to clause 3 or 4, wherein
the one of the plurality of structure bodies is an octagon when viewed along a third direction crossing a plane including the first and second directions.

Clause 6

The light detector according to clause 1 or 2, wherein
the plurality of elements is arranged along a first direction and a second direction, the second direction crossing the first direction,
one of a plurality of the structure bodies includes:
a pair of first extension portions extending in the first direction;
a pair of second extension portions extending in the second direction; and
a plurality of link portions linking the pair of first extension portions and the pair of second extension portions,
one of a plurality of the photodiodes is provided between the pair of second extension portions in the first direction and provided between the pair of first extension portions in the second direction, and each of the plurality of link portions is curved when viewed along a third direction crossing a plane including the first and second directions.

Clause 7

The light detector according to any one of clauses 1 to 6, wherein
one of a plurality of the photodiodes is an avalanche photodiode operating in a Geiger mode.

Clause 8

A light detector, comprising:
a first element including a first photodiode and a structure body surrounding the photodiode, and
a second element including a second photodiode,
the structure body having a different refractive index from the first photodiode,
a plurality of the first elements and a plurality of the second elements alternately provided along a first direction and a second direction, the second direction crossing the first direction,
at least portions of the plurality of structure bodies being separated from each other.
a semiconductor region provided between mutually-adjacent second elements of the plurality of second elements and contacting the mutually-adjacent second elements.

Clause 9

The light detector according to clause 8, further comprising:
a first interconnect electrically connected to at least a portion of the plurality of first elements; and
a second interconnect electrically connected to at least a portion of the plurality of second elements.

Clause 10

The light detector according to clause 9, wherein
mutually-different operating voltages can be applied to the first and second interconnects.

Clause 11

The light detector according to any one of clauses 8 to 10, wherein
a shape of one of a plurality of the first photodiodes is different from a shape of one of a plurality of the second photodiodes when viewed along a third direction crossing a plane including the first and second directions, or
a surface area of one of a plurality of the first photodiodes is different from a surface area of one of a plurality of the second photodiodes when viewed along the third direction.

Clause 12

The light detector according to any one of clauses 8 to 11, wherein
the plurality of first elements respectively includes a plurality of first quenching resistances,
the plurality of second elements respectively includes a plurality of second quenching resistances, and
electrical resistances of the plurality of first quenching resistances each are different from electrical resistances of the plurality of second quenching resistances.

Clause 13

The light detector according to any one of clauses 8 to 11, wherein
the plurality of first elements respectively includes a plurality of first quenching resistances,
the plurality of second elements respectively includes a plurality of second quenching resistances, and
one of the plurality of first quenching resistances exists at a different position from one of the plurality of first photodiodes connected to the one of the plurality of first quenching resistances when viewed along a third direction, the third direction crossing a plane including the first and second directions, and
one of the plurality of second quenching resistances overlaps one of the plurality of second photodiodes connected to the one of the plurality of second quenching resistances when viewed along the third direction.

Clause 14

The light detector according to clause 12, further comprising:
a first interconnect electrically connected to the plurality of first quenching resistances, and
a second interconnect electrically connected to the plurality of second quenching resistances.

Clause 15

A light detector comprising an element,
the element including a photodiode, a quenching resistance electrically connected to the photodiode, and a structure body having a different refractive index from the photodiode and surrounding the photodiode along a plane including a first direction and a second direction, the second direction crossing the first direction,
the structure body being a five-or-higher-sided polygon or a rounded polygon when viewed along a third direction crossing the plane including the first and second directions.

Clause 16

The light detector according to clause 15, wherein
an angle of each interior angle of the polygon is 135 degrees or less, or
at least a portion of vertices of the polygon is curved.

Clause 17

The light detector according to clause 15, wherein
the structure body includes:
a pair of first extension portions extending in the first direction;
a pair of second extension portions extending in the second direction; and
a plurality of link portions linking the pair of first extension portions and the pair of second extension portions, the photodiode is provided between the pair of second extension portions in the first direction and provided between the pair of first extension portions in the second direction, and an angle between the first extension portion and the link portion and an angle between the second extension portion and the link portion are 135 degrees or more, or each of the link portions is curved when viewed along the third direction crossing the plane including the first and second directions.

Clause 18

The light detector according to clause 17, wherein
lengths in the first direction of the first extension portions each are greater than lengths in the first direction of the link portions, and
lengths in the second direction of the second extension portions each are greater than lengths in the second direction of the link portions.

Clause 19

The light detector according to clause 17 or 18, wherein the length in the first direction and the length in the second direction are 1 μm for each of the link portions.

Clause 20

A light detector, comprising:
a first photodiode;
a first structure body surrounding the first photodiode along a plane including a first direction and a second direction, the second direction crossing the first direction;
a second photodiode; and
a second structure body surrounding the second photodiode along the plane,
the first structure body and the second structure body being separated in the first direction or the second direction.

Clause 21

The light detector according to clause 20, further comprising:
a semiconductor region provided between the first structure body and the second structure body,
the semiconductor region contacting the first and second structure bodies.

Clause 22

The light detector according to clause 20 or 21, wherein
the first structure body and the second structure body are five-or-higher-sided polygons when viewed along a third direction crossing the plane.

Clause 23

The light detector according to clause 22, wherein
the first structure body and the second structure body are octagons when viewed along the third direction.

Clause 24

The light detector according to any one of clauses 20 to 23, wherein
the first structure body includes:
a pair of first extension portions extending in the first direction;
a pair of second extension portions extending in the second direction; and
a plurality of link portions linking the pair of first extension portions and the pair of second extension portions,
the first photodiode is provided between the pair of second extension portions in the first direction and provided between the pair of first extension portions in the second direction, and
an angle between the first extension portion and the link portion and an angle between the second extension portion and the link portion are 135 degrees or more.

Clause 25

The light detector according to clause 20 or 21, wherein
at least a portion of vertices of the polygons is curved when viewed along a third direction crossing the plane for the first and second structure bodies.

Clause 26

The light detector according to clause 20 or 21, wherein
the first structure body includes:
a pair of first extension portions extending in the first direction;
a pair of second extension portions extending in the second direction; and
a plurality of link portions linking the pair of first extension portions and the pair of second extension portions,
the first photodiode is provided between the pair of second extension portions in the first direction and provided between the pair of first extension portions in the second direction, and
each of the link portions is curved when viewed along a third direction crossing a plane including the first and second directions.

Clause 27

The light detector according to clause 24 or 26, wherein
a length in the first direction and a length in the second direction are 1 μm for each of the link portions.

Clause 28

The light detector according to any one of clauses 20 to 27, further comprising:
a first interconnect electrically connected to the first photodiode; and
a second interconnect electrically connected to the second photodiode,
the first and second interconnects being capable of having mutually-different operating voltages applied.

Clause 29

The light detector according to any one of clauses 20 to 28, wherein
a shape of the first photodiode is different from a shape of the second photodiode when viewed along a third direction crossing the plane including the first and second directions, or a surface area of the first photodiode is different from a surface area of the second photodiode when viewed along the third direction.

Clause 30

The light detector according to any one of clauses 20 to 29, wherein
the first photodiode is electrically connected to a first quenching resistance,
the second photodiode is electrically connected to a second quenching resistance, and
an electrical resistance of the first quenching resistance is different from an electrical resistance of the second quenching resistance.

Clause 31

The light detector according to clause 30, wherein
a portion of the first quenching resistance exists at a different position from the first photodiode when viewed along a third direction crossing the plane including the first and second directions, and
a portion of the second quenching resistance overlaps the second photodiode when viewed along the third direction.

Clause 32

The light detector according to any one of clauses 20 to 31, wherein
the first photodiode and the second photodiode each are avalanche photodiodes operating in a Geiger mode.

Clause 33

A light detection system, comprising:
the light detector according to any one of clauses 1 to 32; and
a distance measuring circuit calculating, from an output signal of the light detector, a time-of-flight of light.

Clause 34

A lidar device, comprising:
a light source irradiating light on an object; and
the light detection system according to clause 33, the light detection system detecting light reflected by the object.

Clause 35

The lidar device according to clause 34, further comprising:
an image recognition system generating a three-dimensional image based on an arrangement relationship of the light source and the light detector.

Clause 36

A vehicle, comprising:
the lidar device according to clause 34 or 35.

Clause 37

A vehicle, comprising:
the lidar device according to clause 34 or 35 at four corners of a vehicle body.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in the light detector such as the semiconductor part, the structure body, the second structure body, the quenching resistance, the insulating portion, the electrode, the first interconnect, the second interconnect, the common line, the pad, etc., from known art; and such practice is within the scope of the invention to the extent that similar effects can be obtained.

Combinations of any two or more components of the specific examples within the extent of technical feasibility also are within the scope of the invention to the extent that the spirit of the invention is included.

All light detectors, light detection systems, lidar devices, and vehicles practicable by an appropriate design modification by one skilled in the art based on the light detector, the light detection system, the lidar device, and the vehicle described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

Although several embodiments of the invention are described, these embodiments are presented as examples and are not intended to limit the scope of the invention. These novel embodiments may be implemented in other various forms, and various omissions, substitutions, and modifications can be performed without departing from the spirit of the invention. Such embodiments and their modifications are within the scope and spirit of the invention and are included in the invention described in the claims and their equivalents.

What is claimed is:

1. A light detector, comprising:
a plurality of elements respectively including a plurality of photodiodes, the plurality of elements being arranged along a first direction and a second direction crossing the first direction, at least a portion of the plurality of elements respectively including a plurality of structure bodies, each of the plurality of structure bodies surrounding the photodiode, having a different refractive index from the photodiode, and including a first insulating layer, the plurality of structure bodies being separated from each other; and
a semiconductor region provided between mutually-adjacent structure bodies of the plurality of structure bodies and contacting the mutually-adjacent structure bodies,
each of the plurality of elements including a quenching resistance,
a plurality of the quenching resistances overlapping the semiconductor region along a third direction with a second insulating layer interposed,
the third direction crossing a plane including the first and second directions.

2. The detector according to claim 1, wherein
one of the plurality of the structure bodies includes:
   a pair of first extension portions extending in the first direction;
   a pair of second extension portions extending in the second direction; and
   a plurality of link portions linking the pair of first extension portions and the pair of second extension portions,
one of the plurality of the photodiodes is provided between the pair of second extension portions in the first direction and provided between the pair of first extension portions in the second direction, and
an angle between the first extension portion and the link portion and an angle between the second extension portion and the link portion are 135 degrees or more.

3. The detector according to claim 2, wherein
the one of the plurality of structure bodies is an octagon when viewed along the third direction.

4. The detector according to claim 1, wherein
one of the plurality of the structure bodies includes:
   a pair of first extension portions extending in the first direction;
   a pair of second extension portions extending in the second direction; and
   a plurality of link portions linking the pair of first extension portions and the pair of second extension portions,
one of the plurality of the photodiodes is provided between the pair of second extension portions in the first direction and provided between the pair of first extension portions in the second direction, and
each of the plurality of link portions is curved when viewed along the third direction crossing a plane including the first and second directions.

5. The detector according to claim 1, wherein
each of the plurality of photodiodes is an avalanche photodiode operating in a Geiger mode.

6. The detector according to claim 1, wherein each of the plurality of structure bodies is a five-or-higher-sided polygon or a rounded polygon when viewed along the third direction.

7. The detector according to claim 1, wherein
the plurality of elements includes a plurality of first elements and a plurality of second elements alternately provided along the first direction and the second direction,
the plurality of photodiodes includes a plurality of first photodiodes in the plurality of first elements and a plurality of second photodiodes in the plurality of second elements, and
the plurality of first elements respectively includes the plurality of structure bodies.

8. The detector according to claim 7, further comprising:
a first interconnect electrically connected to at least a portion of the plurality of first elements; and
a second interconnect electrically connected to at least a portion of the plurality of second elements.

9. The detector according to claim 8, wherein
mutually-different operating voltages can be applied to the first and second interconnects.

10. The detector according to claim 7, wherein
a shape of one of the plurality of first photodiodes is different from a shape of one of the plurality of second photodiodes when viewed along the third direction, or
a surface area of one of the plurality of first photodiodes is different from a surface area of one of the plurality of second photodiodes when viewed along the third direction.

11. The detector according to claim 7, wherein
the plurality of first elements respectively includes a plurality of first quenching resistances,
the plurality of second elements respectively includes a plurality of second quenching resistances, and
electrical resistances of the first quenching resistances each are different from electrical resistances of the second quenching resistances.

12. The detector according to claim 11, wherein
one of the plurality of first quenching resistances exists at a different position from one of the plurality of first photodiodes connected to the one of the plurality of first quenching resistances when viewed along a third direction, the third direction crossing a plane including the first and second directions, and
one of the plurality of second quenching resistances overlaps one of the plurality of second photodiodes connected to the one of the plurality of second quenching resistances when viewed along the third direction.

13. The light detector according to claim 11, further comprising:
a first interconnect electrically connected to the plurality of first quenching resistances, and
a second interconnect electrically connected to the plurality of second quenching resistances.

14. A light detection system, comprising:
the light detector according to claim 1; and
a distance measuring circuit calculating, from an output signal of the light detector, a time-of-flight of light.

15. A lidar device, comprising:
a light source irradiating light on an object; and
the light detection system according to claim 14, the light detection system detecting light reflected by the object.

16. The lidar device according to claim 15, further comprising:
an image recognition system generating a three-dimensional image based on an arrangement relationship of the light source and the light detector.

17. A vehicle, comprising:
the lidar device according to claim 15.

* * * * *